(12) United States Patent
Oshima et al.

(10) Patent No.: US 10,707,894 B2
(45) Date of Patent: Jul. 7, 2020

(54) ANALOG/DIGITAL CONVERTER AND MILIMETER WAVE RADAR SYSTEM

(71) Applicant: Renesas Electronics Corporation, Tokyo (JP)

(72) Inventors: Takashi Oshima, Tokyo (JP); Tetsuo Matsui, Tokyo (JP); Mitsuya Fukazawa, Tokyo (JP); Tomohiko Yano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 319 days.

(21) Appl. No.: 15/900,598

(22) Filed: Feb. 20, 2018

(65) Prior Publication Data

US 2018/0302102 A1  Oct. 18, 2018

(30) Foreign Application Priority Data

Apr. 18, 2017  (JP) .................................. 2017-081903

(51) Int. Cl.
| | |
|---|---|
| *H03M 3/00* | (2006.01) |
| *H03H 21/00* | (2006.01) |
| *G01S 13/02* | (2006.01) |
| *G01S 7/35* | (2006.01) |

(52) U.S. Cl.
CPC ............. *H03M 3/414* (2013.01); *G01S 7/354* (2013.01); *G01S 13/0209* (2013.01); *H03H 21/0012* (2013.01); *H03M 3/388* (2013.01); *H03M 3/458* (2013.01); *H03M 3/38* (2013.01)

(58) Field of Classification Search
CPC ...... H03M 3/414; H03M 3/388; H03M 3/458; H03H 21/002; G01S 7/354; G01S 13/0209
See application file for complete search history.

(56) References Cited

U.S. PATENT DOCUMENTS 5,369,404 A * 11/1994 Galton .................... H03D 3/241
341/143
6,577,259 B1 * 6/2003 Jelonnek ............. H03M 7/3022
341/143

(Continued)

OTHER PUBLICATIONS

Yun-Shiang Shu and four others, "LMS-Based Noise Leakage Calibration of Cascaded Continuous-Time ΔΣ Modulators", IEEE JSSC, vol. 45, Feb. 2010, p. 368-379.

(Continued)

*Primary Examiner* — Peter M Bythrow
(74) *Attorney, Agent, or Firm* — McDermott Will & Emery LLP

(57) ABSTRACT

A modulator includes an analog integrator including an analog circuit and a quantizer quantizing its output signal. An external input signal is input thereto. A modulator is coupled to the latter stage of the modulator, and includes a quantizer. A probe signal generation circuit injects a probe signal to the modulator. An adaptive filter searches for a transfer function of the modulator by observing an output signal of the quantizer in accordance with a probe signal. Another adaptive filter searches for a transfer function of the modulator by observing an output signal of the quantizer in accordance with the probe signal. A noise cancel circuit cancels a quantization error generated by the quantizer using search results of the adaptive filters.

20 Claims, 20 Drawing Sheets

(56) References Cited

U.S. PATENT DOCUMENTS

| | | | | |
|---|---|---|---|---|
| 6,873,281 B1* | 3/2005 | Esterberg | ............ | H03M 3/344 |
| | | | | 341/143 |
| 6,970,120 B1 | 11/2005 | Bjornsen | | |
| 6,975,682 B2* | 12/2005 | Cosand | ............... | H03M 3/338 |
| | | | | 341/200 |
| 10,020,968 B1* | 7/2018 | Rodenbeck | ............ | G01S 7/288 |
| 2006/0164276 A1* | 7/2006 | Luh | ................... | H03M 1/0668 |
| | | | | 341/155 |
| 2010/0176976 A1* | 7/2010 | Breems | ............... | H03M 3/386 |
| | | | | 341/120 |
| 2011/0163900 A1* | 7/2011 | Pagnanelli | ........... | H03M 3/468 |
| | | | | 341/143 |
| 2012/0068868 A1* | 3/2012 | Ahmed | ............... | H03M 3/372 |
| | | | | 341/143 |
| 2017/0179975 A1* | 6/2017 | Dong | ................. | H03M 3/322 |
| 2017/0180026 A1* | 6/2017 | Flynn | ................. | H04B 7/0617 |

OTHER PUBLICATIONS

European Search Report dated Sep. 6, 2018 for European Patent Application No. 18156177.0-1203.

Sudharsan Kanagaraj and Bahar Jalali Farahani, "An Online Fully-digital Calibration of Leakage Noise in MASH Continuous Time ΔΣ Modulators", IEEE 2011, p. 1632-1635.

Alireza Bafandeh and Mohammad Yavari, "Digital Calibration of Amplifier Finite DC Gain and Gain Bandwidth in MASH ΔΣ Modulators", IEEE TCS, vol. 63, Apr. 2015, p. 321-325.

\* cited by examiner

ANALOG/DIGITAL CONVERTER AND MILIMETER WAVE RADAR SYSTEM

CROSS-REFERENCE TO RELATED APPLICATIONS

The disclosure of Japanese Patent Application No. 2017-081903 filed on Apr. 18, 2017 including the specification, drawings and abstract is incorporated herein by reference in its entirety.

BACKGROUND

The present invention relates to an analog/digital converter and a millimeter wave radar system, and relates, for example, to a calibration technique in a MASH (Multi stAge Noise SHaping) type or sigma-delta ($\Sigma\Delta$) type analog/digital converter.

For example, U.S. Pat. No. 6,970,120 discloses an analog/digital converter circuit including a calibration circuit which searches for a filter coefficient of a calibration filter. The calibration circuit inputs a pseudo-random signal to the analog/digital converter circuit, in a start-up time of the analog/digital converter circuit, and searches for a filter coefficient while observing the final output.

Non-Patent Literature 1 (Yun-Shiang Shu and four others, "LMS-Based Noise Leakage Calibration of Cascaded Continuous-Time Δ Modulators", IEEE JSSC, Vol.45, February 2010, p.368-379) discloses a method for performing calibration in a manner that a time constant of an analog loop filter coincides with that of a digital noise cancel filter, in $\Delta\Sigma$ modulator. Particularly, the time constant of the analog loop filter is searched using an LMS (Leas Mean Square) algorithm, while injecting binary pulses to a quantizer. This analog loop filter is to zeroize residual power in the final output.

SUMMARY

For example, millimeter wave radar systems for on-vehicle use need a robust analog/digital converter (in this specification, called an ADC) having a high resolution and a wide signal band. As an ADC satisfying this need, a known one is a MASH type (cascaded type) sigma-delta ($\Sigma\Delta$) ADC (also called a delta sigma ($\Delta\Sigma$) ADC). Note, however, that in the MASH type $\Sigma\Delta$ ADC, it is not possible to enhance the resolution, if a characteristic variation occurs in the analog circuit. It is thought to perform calibration using the methods of U.S. Pat. No. 6,970,120 and the Non-Patent Literature 1. However, calibration may not sufficiently be performed in accordance with methods of U.S. Pat. No. 6,970,120 and the Non-Patent Literature 1.

Preferred embodiments as will be described below have been made in consideration of the above. Other objects and new features will be apparent from the following descriptions of this specification and the accompanying drawings.

According to an embodiment, there is provided an analog/digital converter as a MASH type and sigma-delta type analog/digital converter comprising a first and a second modulator, a probe signal generation circuit, a first and a second adaptive filter, and a noise cancel circuit. The first modulator includes a first analog integrator including an analog circuit and a first quantizer quantizing an output signal of the first analog integrator. An external input signal as an analog signal is input thereto. The second modulator is coupled to a latter stage of the first modulator, and includes a second quantizer. The probe signal generation circuit injects a probe signal to the first modulator. The first adaptive filter searches for a transfer function of the first modulator by observing an output signal of the first quantizer in accordance with the probe signal. The second adaptive filter searches for a transfer function of the second modulator by observing an output signal of the second quantizer in accordance with the probe signal. The noise cancel circuit cancels a quantization error generated by the first quantizer using search results of the first and the second adaptive filters.

According to the embodiment, it is possible to realize an analog/digital converter having a high resolution.

DESCRIPTIONS OF THE PREFERRED EMBODIMENTS

Figure 1:
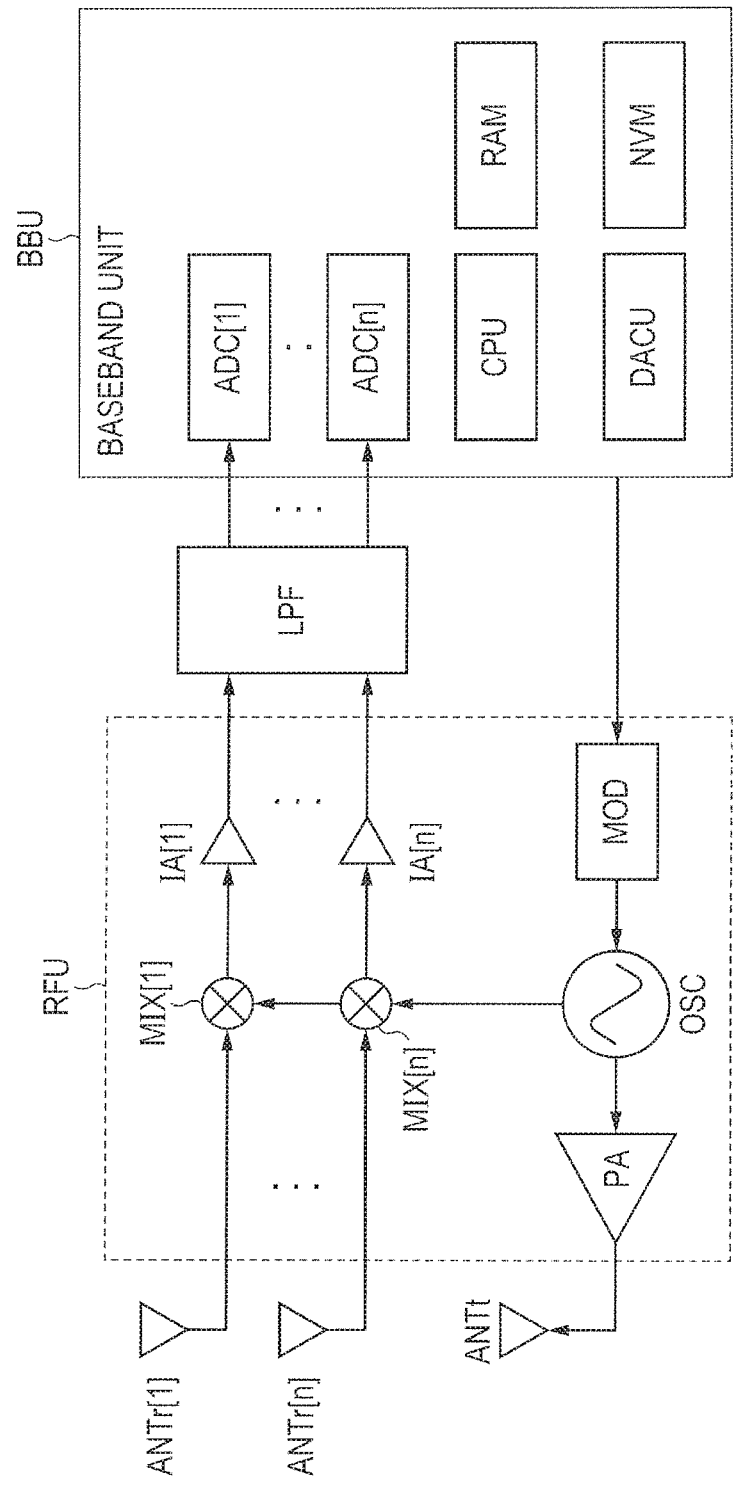
FIG. 1 is a schematic diagram illustrating a configuration example of the main part of a millimeter wave radar system according to an embodiment 1 of the present invention.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of a part or whole of the other. In the following preferred embodiments, in the case of reference to the number of elements (including the quantity, numeric value, amount, range), unless otherwise specified and unless clearly limited in principle, the present invention is not limited to the specified number, and a number over or below the specified one may be used.

Further, in the following preferred embodiments, the constituent elements (including the element steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values and the range.

Though no particular restriction is made, circuit elements included in each functional block of the preferred embodiments are formed on a semiconductor substrate, like single crystal silicon, using an integrated circuit technology, such as a well-known CMOS (Complementary MOS transistor).

Descriptions will now specifically be made to the preferred embodiments of the present invention based on the illustrations. In the drawings below for explaining the preferred embodiments, the same constituent elements are identified by the same reference symbols, and thus may not be described over and over as needed.

Embodiment 1

Scheme of Millimeter Wave Radar System

FIG. 1 is a schematic diagram illustrating a configuration example of the main part of a millimeter radar system according to an embodiment 1 of the present invention. The millimeter wave radar system illustrated in FIG. 1 includes a baseband unit BBU, a high frequency unit RFU, a low-pass filter LPF, a transmission antenna ANTt, an "n" number (n is an integer equal to or greater than 1) of reception antennas ANTr [1] to ANTr [n]. The high frequency unit RFU performs various signal processes in a high frequency band, includes a modulator MOD, an oscillator OSC, and a power amplifier PA as transmission circuits, and includes an "n" number of mixers MIX [1] to MIX [n] and an "n" number of amplifiers IA [1] to IA [n] as reception circuits.

The baseband unit BBU is configured with one semiconductor chip, for example, a micro controller, and performs various signal processes in a baseband. The baseband unit BBU includes an "n" number of analog/digital converters ADC [1] to ADC [n], a CPU (Central Processing Unit), a RAM (Random Access Memory), a digital/analog converter DACU, and a non-volatile memory NVM, such as a flash memory.

The modulator MOD and the oscillator OSC generate a frequency-modulated transmission wave (a transmission wave with an FM-CW method) or two transmission waves (transmission waves with a two-frequency CW method) with different frequencies, under the control of the baseband unit BBU. The transmission waves include frequencies of 60 GHz band or 76 GHz band, and are transmitted from the transmission antenna ANTt through the power amplifier PA.

The transmission wave transmitted from the transmission antenna ANTt is reflected by an object, and then received by an "n" number of reception antennas ANTr [1] to ANTr [n]. The "n" number of mixers MIX [1] to MIX [n] down-convert respectively the received waves (reflected waves) received by the reception antennas ANTr [1] to ANTr [n] using a transmission wave from the oscillator OSC, thereby outputting an "n" number of beat signals. The "n" number of beat signals are input to the "n" number of analog/digital converters ADC [1] to ADC [n] of the baseband unit BBU through the low-pass filter (an anti-aliasing filter) LPF.

The "n" number of analog/digital converters ADC [1] to ADC [n] include the MASH type and sigma-delta ($\Sigma\Delta$) type configuration, as will specifically be described below, and convert the beat signals from the low-pass filter LPF into digital signals. The baseband unit BBU processes the digital signals from the analog/digital converters ADC [1] to ADC [n] using the CPU, thereby detecting the distance or the relative speed to the object.

This millimeter wave radar system is used in various fields, such as representatively automobiles or medial equipments. To improve the performance of the radar, it is required that the "n" number of analog/digital converters ADC [1] to ADC [n] have a high resolution (that is, a wide dynamic range) and a wide signal band. A sigma-delta ADC is known as an ADC satisfying this requirement.

The sigma-delta ADC has a high sampling rate (sampling frequency), in operation principle for performing the over sampling. Thus, it is possible to relax the specification of the low-pass filter (an anti-aliasing filter) LPF, and it is more effective than the case in which a Nyquist ADC (for example, a pipeline type, a successive comparison type, or a flash type). In the sigma-delta ADC, it is possible to use a discrete time type (for example, a switched capacitor type) integrator or a continuous time type (for example, an RC type) integrator. If the continuous time type integrator is used, the characteristic of the low-pass filter LPF can further be relaxed. This may facilitate widening of the signal band of the sigma-delta ADC.

Scheme and Problem of Analog/digital Converter (Comparative Example)

Figure 19:
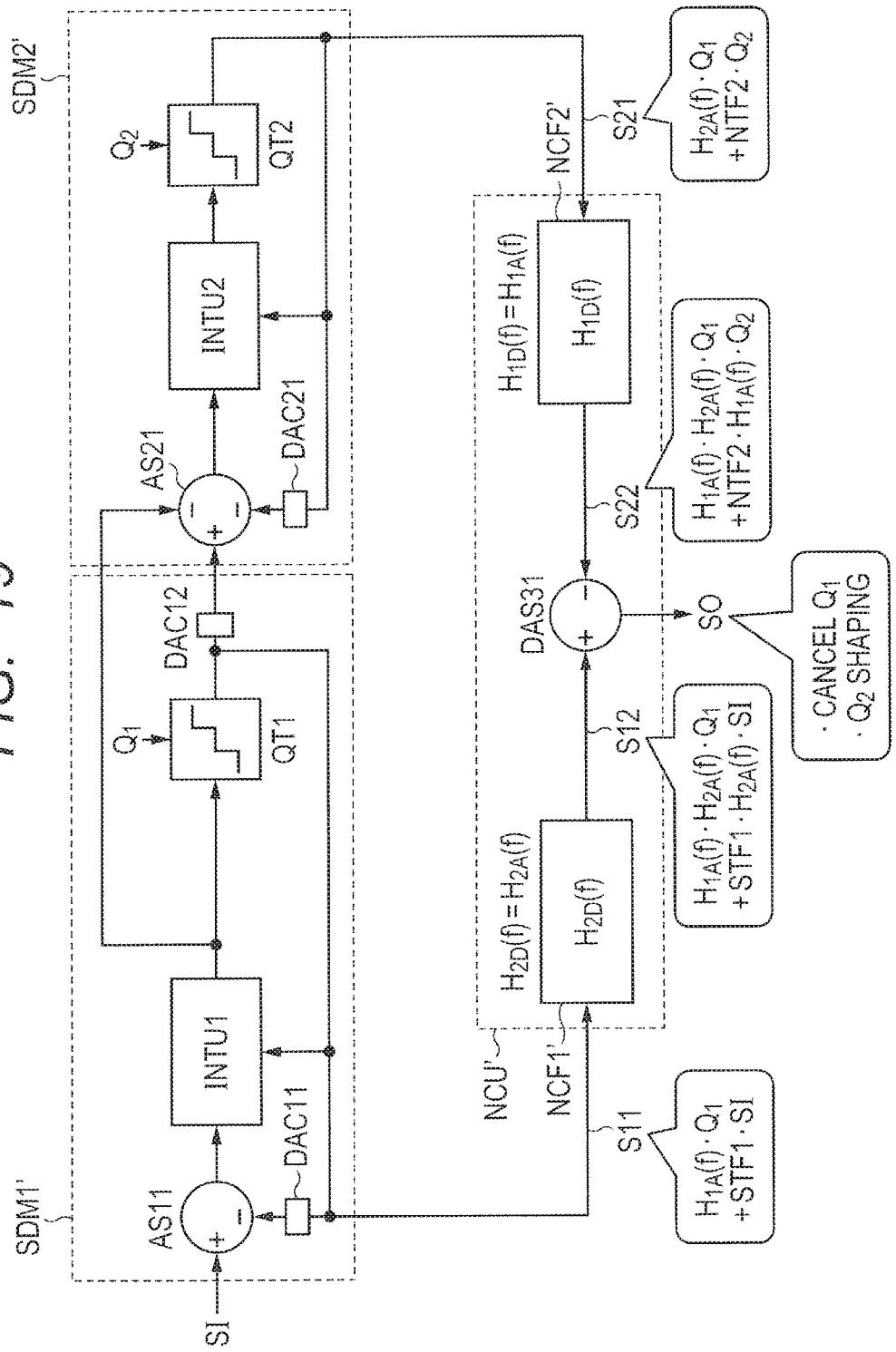
FIG. 19 is a circuit block diagram illustrating a basic configuration example and an operation example of a MASH type sigma-delta ADC.

FIG. 19 is a circuit block diagram illustrating a basic configuration example and an operation example of the MASH type sigma-delta ADC. The MASH type sigma-delta ADC illustrated in FIG. 19 includes modulators (sigma-delta modulators) SDM1' and SDM2' in plural stages (in this case, two stages) and a noise cancel circuit NCU'. To this ADC, an external input signal SI as an analog signal is input. The ADC outputs an external output signal SO as a digital signal. The modulator SDM1' in the first stage includes an analog adder/subtracter AS11, an analog integrator unit INTU1, a quantizer QT1, and digital/analog converter circuits DAC11 and DAC12.

The quantizer QT1 quantizes an output signal of the analog integrator unit INTU1 configured with an analog circuit. The digital/analog converter circuits DAC11 and DAC12 both convert an output signal of the quantizer QT1 into an analog signal. The analog adder/subtracter AS11 outputs a differential signal between an external input signal SI and an output signal of the digital/analog converter circuit DAC11 to the analog integrator unit INTU1. In the quantizer QT1, a quantization error $Q_1$ is generated in a form of being added by the quantizer QT1. This quantization error $Q_1$ can be extracted from the differential signal between the output signal of the digital/analog converter circuit DAC12 and the output signal of the analog integrator unit INTU1.

The modulator SDM2' in the second stage includes an analog adder/subtracter AS21, an analog integrator unit INTU2, a quantizer QT2, and a digital/analog converter circuit DAC21. The quantizer QT2 quantizes an output signal of the analog integrator unit INTU2 configured with an analog circuit. In the quantizer QT2 also, like the case of the quantizer QT1, a quantization error $Q_2$ is generated. The digital/analog converter circuit DAC21 converts an output signal of the quantizer QT2 into an analog signal. The analog adder/subtracter AS21 outputs a differential signal between the extracted signal of the quantization error $Q_1$ in the above-described modulator SDM1' and the output signal of the digital/analog converter circuit DAC21 to the analog integrator unit INTU2.

The noise cancel circuit NCU' includes noise cancel filters NCF1' and NCF2' and a digital adder/subtracter DAS31. The noise cancel filter NCF1' is a digital filter to which an output signal S11 of the quantizer QT1 is input, the noise cancel filter NCF2' is a digital filter to which an output signal S21 of the quantizer QT2 is input. The digital filters may, for example, be a FIR (Finite Impulse Response) filter for realizing a desired filter characteristic using a plurality of tap coefficients or an IIR (Infinite Impulse Response) filter. The digital adder/subtracter DAS31 calculates a difference (in this case "S12-S22") between an output signal S12 of the noise cancel filter NCF1' and an output signal S22 of the noise cancel filter NCF2', and outputs an external output signal SO.

In this specification, a transfer function $H_{1A}(f)$ is defined as "a transfer function from an application point of the quantization error $Q_1$ up to the output signal S11 of the modulator SDM1' (the quantizer QT1)". In the example of FIG. 19, the transfer function $H_{1A}(f)$ coincides with a noise transfer function (NTF) of the modulator SDM1'. A transfer function $H_{2A}(f)$ is defined as "a transfer function from an application point of the quantization error $Q_1$ up to the output signal S21 of the modulator SDM2' (the quantizer QT2)". In the example of FIG. 19, the transfer function $H_{2A}(f)$ coincides with a signal transfer function (STF) of the modulator SDM2'.

The output signal S11 of the modulator SDM1' is "$H_{1A}(f) \cdot Q_1 + STF1 \cdot SI$" (STF1 is a signal transfer function of the modulator SDM1'). The output signal S21 of the modulator SDM2' is "$H_{2A}(f)Q_1 + NTF2 \cdot Q_2$" (NTF2 is a noise transfer function of the modulator SDM2'). A transfer function $H_{2D}(f)$ of the noise cancel filter NCF1' is set as the transfer function $H_{2A}(f)$ in advance, and a transfer function $H_{1A}(f)$ of the noise cancel filter NCF2' is set as the transfer function $H_{1A}(f)$ in advance. As a result, the output signal S12 of the noise cancel filter NCF1' is "$H_{1A}(f) \cdot H_{2A}(f) \cdot Q_1 + STF1 \cdot H_{2A}(f) \cdot SI$", and the output signal S22 of the noise cancel filter NCF2' is "$H_{2A}(f) \cdot H_{1A}(f) \cdot Q_1 + NTF2 \cdot H_{1A}(f) \cdot Q_2$".

As a result, in the external output signal SO, an external input signal SI is delayed by a degree of (that is, by a degree of total integration of the analog integrator units INTU1 and INTU2) "$STF1 \cdot H_{2A}(f)$", and then output. The quantization error $Q_1$ is canceled. Further, the quantization error $Q_2$ is reduced with noise shaping by a degree (by a degree of total integration) of "$NTF2 \cdot H_{1A}(f)$".

For example, in the millimeter wave radar system of FIG. 1, an input noise with a high frequency component may be generated. The MASH type sigma-delta ADC can stably operate even if the external input signal SI includes a high frequency component, as compared with the non-MASH type (a single loop type) sigma-delta ADC. That is, generally, it is necessary to increase the degree of the integrator, to realize a high resolution of the sigma-delta ADC. For example, when to realize the fourth degree in the MASH type sigma-delta ADC of FIG. 19, the analog integrator units INTU1 and INTU2 may be configured respectively with secondary integrators. In the non-MASH type ADC, quarternary integrators are necessary in a single loop. As a result, a loop operation may easily be unstably processed, if the external input signal SI includes a high frequency component.

For example, when the quarternary MASH type sigma-delta ADC is used, the quantization error $Q_2$ is sufficiently reduced to an ignorable level, by noise shaping corresponding to the fourth degree. Thus, in the MASH type sigma-delta ADC, it is possible to attain a high resolution thereof as long as the quantization error $Q_1$ can be canceled. However, when the quantization error $Q_1$ is not sufficiently canceled, the resolution is lowered due to the residual quantization error $Q_1$.

Figure 20:
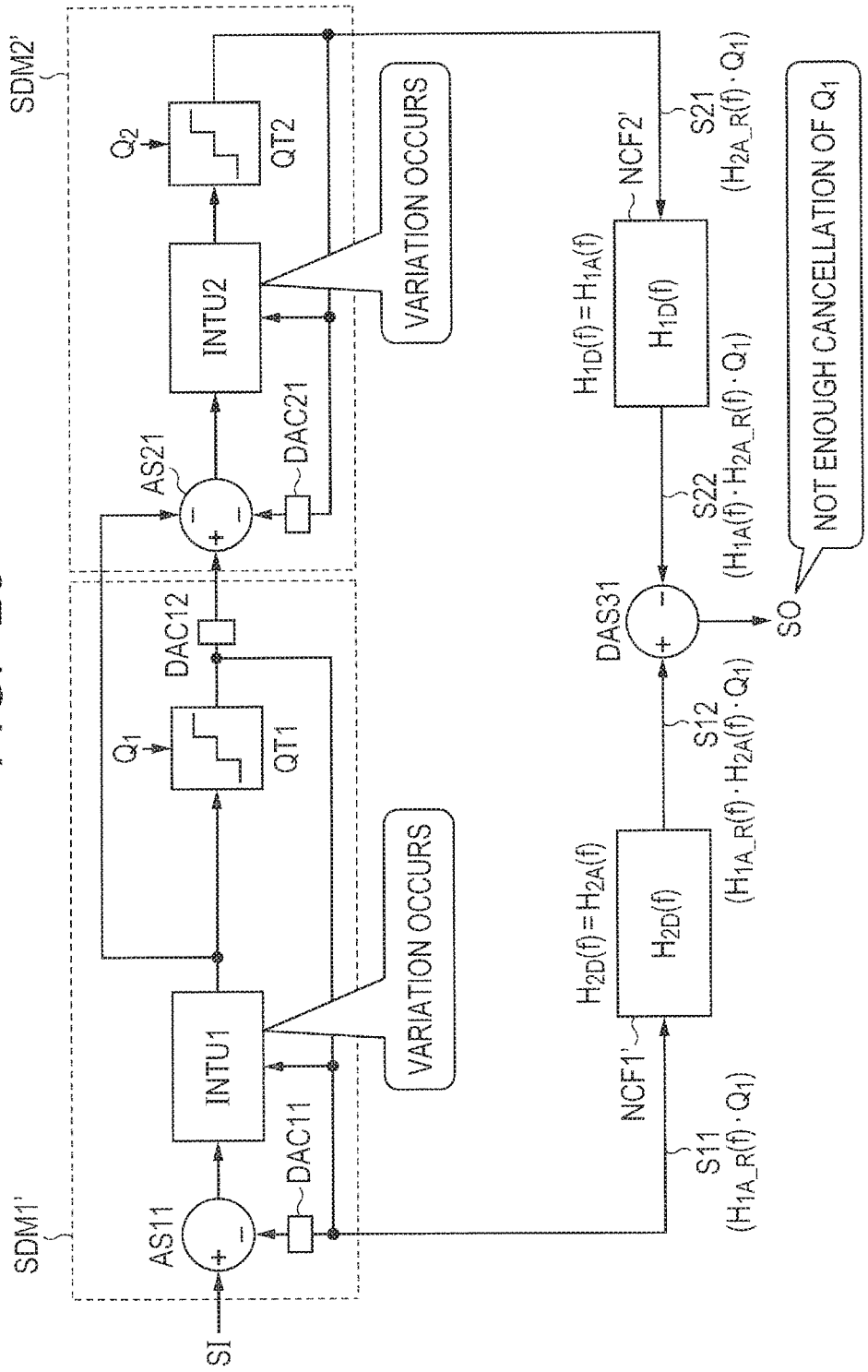
FIG. 20 is a diagram illustrating an example of a problem in the MASH type sigma-delta ADC of FIG. 19.

FIG. 20 is a diagram illustrating an example of a problem in the MASH type sigma-delta ADC of FIG. 19. As illustrated in FIG. 20, in the actual analog integrator units INTU1 and INTU2, various characteristic variations may be generated with reference to a certain ideal state. Some factors of the characteristic variation include a manufacturing variation of RC (resistor, capacitor) elements, the gain insufficiency of the operational amplifier, and the band insufficiency, in the case of a continuous-time type integrator.

"$H_{1A}(f) \cdot Q_1$" in the output signal S11 of the modulator SDM1' in FIG. 19 is actually "$H_{1A\_R}(f) \cdot Q_1$", as illustrated in FIG. 20. The transfer function $H_{1A\_R}(f)$ is an actual transfer function for an ideal transfer function $H_{1A}(f)$. Similarly, "$H_{2A}(f)Q_1$" in the output signal S21 of the modulator SDM2' of FIG. 19 is actually "$H_{2A\_R}(f) \cdot Q_1$", as illustrated in FIG. 20. The transfer function $H_{2A\_R}(f)$ is an actual transfer function for an ideal transfer function $H_{2A}(f)$. The transfer functions $H_{2D}(f)$ and $H_{1D}(f)$ of the noise cancel filter NCF1' are ideal transfer functions $H_{2A}(f)$ and $H_{1A}(f)$ which are set in advance. As a result, the quantization error $Q_1$ in the external output signal SO is not sufficiently canceled.

Figure 21:
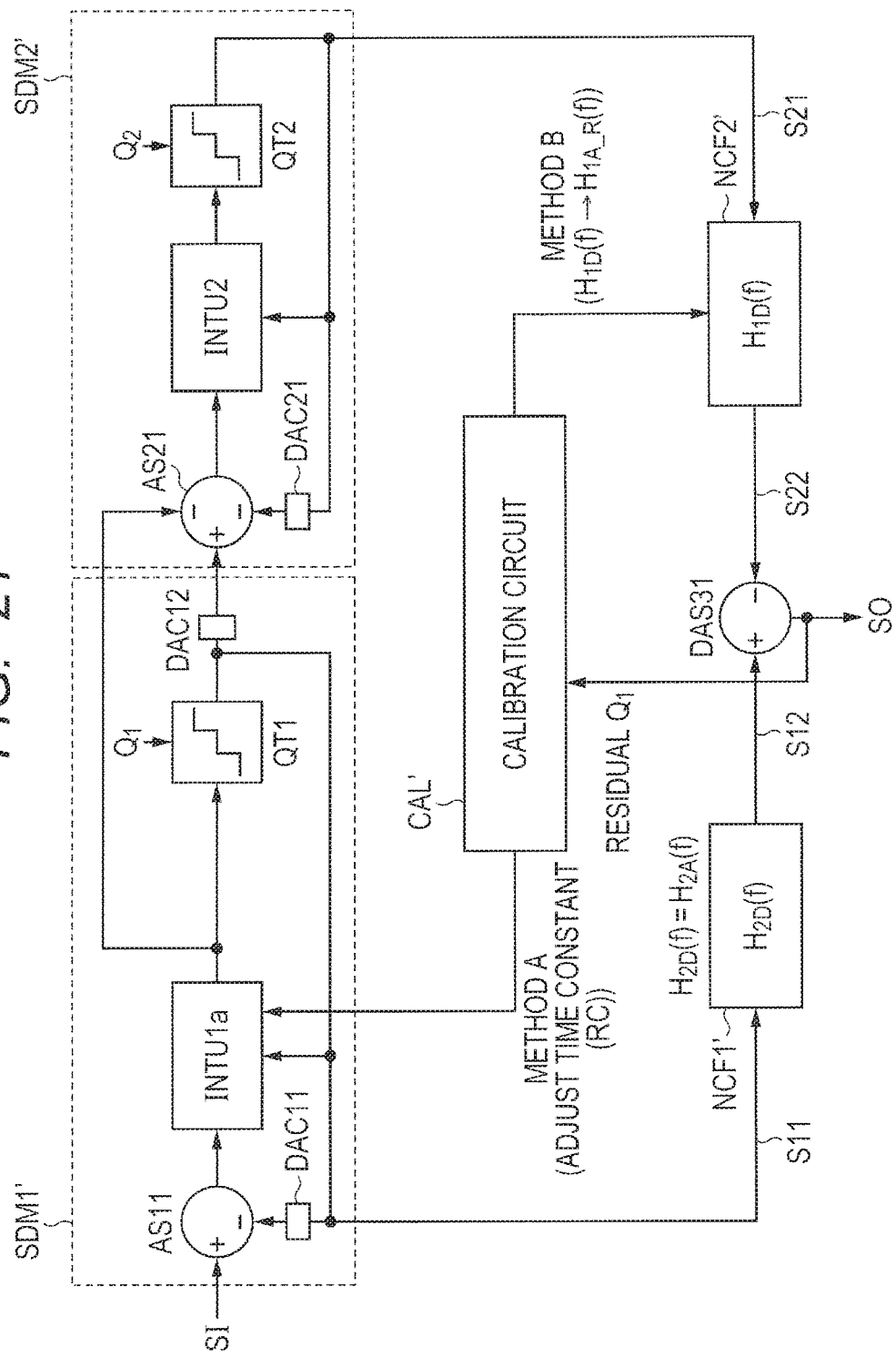
FIG. 21 is a circuit block diagram illustrating a schematic configuration example and an operation example of the main part of an analog/digital converter as a comparative example of the present invention.

FIG. 21 is a circuit block diagram illustrating a schematic configuration example and an operation example of the main part of an analog/digital converter as a comparative example of the present invention. To solve the problem shown in FIG. 20, there is given the method illustrated in FIG. 21. In FIG.

21, as compared with the configuration example of FIG. 19, the analog integrator unit INTU1 is replaced by an analog integrator unit INTU1a including a variable circuit parameter, and a calibration circuit CAL' is added thereto.

According to a method (a method A) of the comparative example 1, the actual transfer functions $H_{1A\_R}$ (f) and $H_{2A\_R}$ (f) are adjusted and made approximate to the transfer functions $H_{1A}$ (f) and $H_{2A}$ (f) in an ideal state. In the example of FIG. 21, in order for the actual transfer function $H_{1A\_R}$ (f) to be made approximate to the transfer function $H_{1A}$ (f) in the ideal state, the analog integrator unit INTU1a is provided. While the calibration circuit CAL' observes the residual quantization error $Q_1$ in an external output signal SO in a predetermined calibration period, it adjusts and minimizes a circuit parameter (specifically, a time constant of the RC) in the analog integrator unit INTU1a.

However, in this method A, because the characteristic variation of the operational amplifier in the analog integrator unit INTU1a is not adjusted, the quantization error $Q_1$ in the external output signal SO is still insufficiently canceled. Similarly, the analog integrator unit INTU2 may also be adjusted. In this manner, when a plurality of analog integrator units are adjusted based on one observation result (the residual quantization error $Q_1$ in the external output signal SO), an adjustment process may undesirably be complicated, and adjustment accuracy may undesirably be lowered. In some case, it may be difficult to obtain the solution.

On the other hand, according to a method (a method B) of a comparative example 2, one of (in this case, NCF1') the noise cancel filters NCF1' and NCF2' is fixed, and the other one thereof (NCF2') is adjusted. Specifically, while the calibration circuit CAL' observes the residual quantization error $Q_1$ in the external output signal SO in, for example, a predetermined calibration period, it adjusts and minimizes a tap coefficient of the noise cancel filter NCF2'.

In the method B, because only one of the noise cancel filter NCF1' and NCF2' is adjusted, the quantization error $Q_1$ in the external output signal SO is still insufficiently canceled. Similarly, the other one of the noise cancel filters NCF1' and NCF2' may be adjusted. However, like the case of the method A, if two noise cancel filters are adjusted based on one observation result, the adjustment process may undesirably be complicated, and the adjustment accuracy may undesirably be lowered. In some case, it may be difficult to obtain the resolution.

Scheme of Analog/Digital Converter (Embodiment 1)

Figure 2:
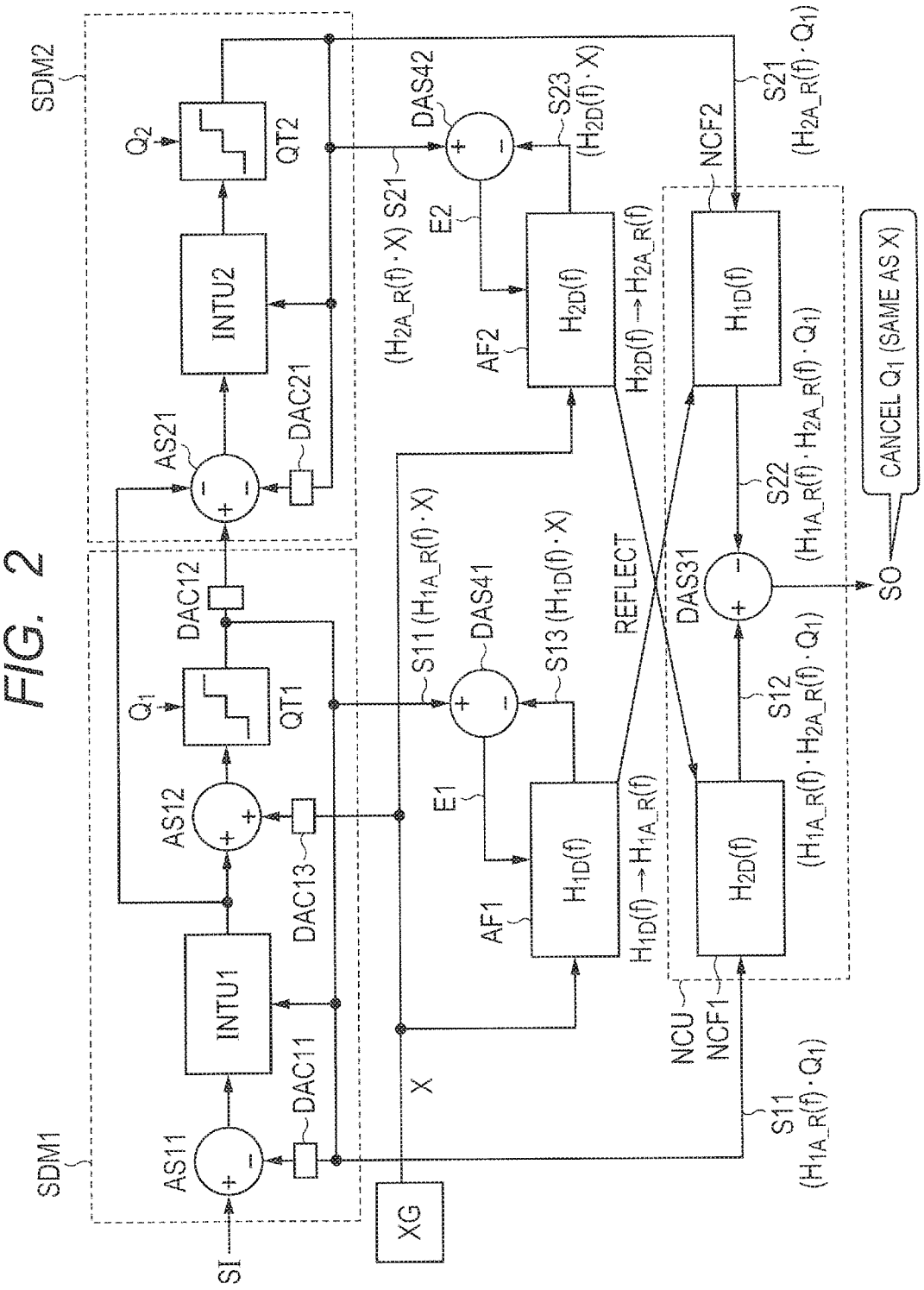
FIG. 2 is circuit block diagram illustrating a schematic configuration example and an operation example of the main part of an analog/digital converter according to the embodiment 1 of the present invention.

FIG. 2 is a circuit block illustrating a schematic configuration example and an operation example of the main part of the analog/digital converter according to the embodiment 1 of the present invention. The MASH type sigma-delta ADC illustrated in FIG. 2 includes modulators (sigma-delta type modulators) SDM1 and SDM2 in plural stages (in this case, two stages), a noise cancel circuit NCU, and additionally a calibration circuit. The calibration circuit includes a probe signal generation circuit XG, a plurality of (in this case, two) adaptive filters AF1 and AF2, and a plurality of (in this case, two) digital adders/subtracters DAS41 and DAS42.

Like the modulator SDM1' of FIG. 19, the modulator SDM1 includes the analog adder/subtracter AS11, the analog integrator unit INTU1, the quantizer QT1, and digital/analog converter circuits DAC11 and DAC12. In addition, unlike the modulator SDM1' of FIG. 19, the modulator SDM1 includes the analog adder/subtracter AS12 inserted into the input of the quantizer QT1 and a digital/analog converter circuit DAC13 coupled to the input. Like the modulator SDM2' of FIG. 19, the modulator SDM2 includes the analog adder/subtracter AS21, the analog integrator unit INTU2, the quantizer QT2, and the digital/analog converter circuit DAC21.

The probe signal generation circuit XG generates a probe signal X. The probe signal X is, for example, a pseudo-random signal, and is preferably a 1-bit (binary value) pseudo-random signal. After the probe signal X is converted into an analog signal through the digital/analog converter circuit DAC13 of the modulator SDM1, it is injected to an input signal of the quantizer QT1 through the analog adder/subtracter AS12. The probe signal X is also input to the adaptive filters AF1 and AF2, as a digital signal.

The adaptive filter AF1 observes the output signal S11 of the modulator SDM1 (quantizer QT1) in accordance with a probe signal X, thereby searching for the actual transfer function of the modulator SDM1. Specifically, the digital adder/subtracter DAS41 calculates an error between the output signal S11 of the modulator SDM1 (quantizer QT1) in accordance with the probe signal X and an output signal S13 of the adaptive filter AF1, and generates an error signal E1 as a calculation result thereof. The adaptive filter AF1 searches for its own filter coefficient (a tap coefficient) using an LMS (Least Mean Square) algorithm, based on the probe signal X and the error signal E1.

At this time, an injection point of the probe signal X and an application point of the quantization error $Q_1$ are substantially the same. Thus, the output signal S11 includes a component of "$H_{1A\_R}$ (f)·X", using the actual transfer function $H_{1A\_R}$ (f) for the above-described quantization error $Q_1$. The output signal S13 is "$H_{1D}$ (f)·X". Strictly speaking, the output signal S11 includes also a component of the quantization error $Q_1$ and a component of the external input signal SI, as illustrated in FIG. 19. Note, however, that the components of the quantization error $Q_1$ and the external input signal SI are ignorable, from the viewpoint of an input signal to the adaptive filter AF1 through the digital adder/subtracter DAS41, as will specifically be described later. The adaptive filter AF1 searches for a tap coefficient for minimizing the error between the output signal S11 and the output signal S13. As a result, the transfer function $H_{1D}$ (f) of the adaptive filter AF1 is converged to the transfer function $H_{1A\_R}$ (f).

Similarly, the adaptive filter AF2 observes the output signal S21 of the modulator SDM2 (the quantizer QT2) in accordance with the probe signal X, thereby searching for the actual transfer function of the modulator SDM2. Specifically, the digital adder/subtracter DAS42 calculates an error between the output signal S21 of the modulator SDM2 (the quantizer QT2) in accordance with the probe signal X and an output signal S23 of the adaptive filter AF2, and generates an error signal E2 as the calculation result. The adaptive filter AF2 searches for its own filter coefficient (a tap coefficient) using the LMS algorithm, based on the probe signal X and the error signal E2.

At this time, because an injection point of the probe signal X and an application point of the quantization error $Q_1$ are substantially the same, the output signal S21 includes a component of "$H_{2A\_R}$ (f)·X" using the actual transfer function $H_{2A\_R}$ (f) for the above-described quantization error $Q_1$. The output signal S23 is "$H_{2D}$ (f)·X". Strictly speaking, as described in FIG. 19, the output signal S21 includes a component of the quantization error $Q_1$ and a component of the quantization error $Q_2$. Note, however, that the components of the quantization error $Q_1$ and the quantization error $Q_2$ are ignorable, from the viewpoint of an input signal to the adaptive filter AF2 through the digital adder/subtracter DAS42, as will specifically be described later. The adaptive filter AF2 searches for a tap coefficient for minimizing an error between the output signal S21 and the output signal S23. As a result, the transfer function $H_{2D}$ (f) of the adaptive filter AF2 is converged to the transfer function $H_{2A\_R}$ (f).

The noise cancel circuit NCU includes noise cancel filters NCF1 and NCF2 and a digital adder/subtracter DAS31. The digital adder/subtracter DAS31 is the same as that of FIG. 19. Like the noise cancel filters NCF1' and NCF2' of FIG. 19, the noise cancel filters NCF1 and NCF2 respectively include the transfer functions $H_{2D}$ (f) and $H_{1D}$ (f). Unlike the case of FIG. 19, the noise cancel filter NCF1 includes a tap coefficient (that is, the transfer function $H_{2A\_R}$ (f)) based on the search result of the adaptive filter AF2, while the noise cancel filter NCF2 includes a tap coefficient (that is, the transfer function $H_{1A\_R}$ (f)) based on the search result of the adaptive filter AF1.

Accordingly, the quantization error $Q_1$ can be canceled in the external output signal SO. The probe signal X is also transmitted through the same path as the quantization error $Q_1$, thereby canceling it in the external output signal SO. As a result, as described in FIG. 19, the external output signal SO includes a component of the external input signal SI and a component of the noise-shaped quantization error $Q_2$. The probe signal X is assumed, for example, as a (10.1) 1-bit (binary value) digital signal, and the digital/analog converter circuit DAC13 converts the probe signal X into a voltage signal of "±0.1 *Vref (V)", using a reference voltage as Vref. Unlike the case of FIG. 21, injection of the probe signal X may be performed parallelly with the A/D conversion process of the external input signal SI (that is, in the background).

Details of Analog Integrator Unit

Figure 3:
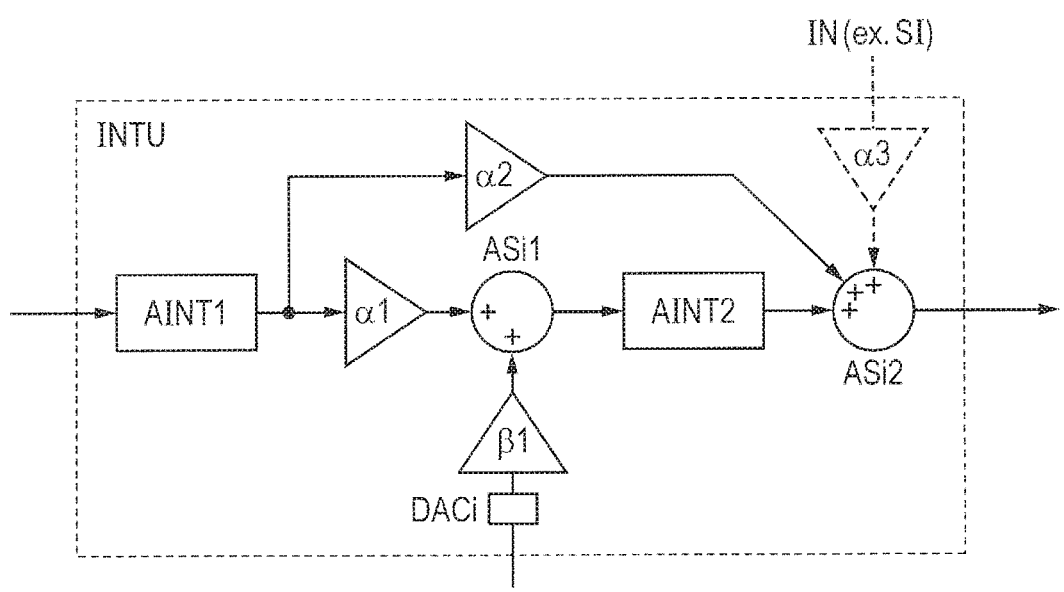
FIG. 3 is a circuit block diagram illustrating a configuration example of an analog integrator unit in FIG. 2.

FIG. 3 is a circuit block diagram illustrating a configuration example of an analog integrator unit in FIG. 2. The analog integrator unit INTU illustrated in FIG. 3 includes two (that is, two stages) analog integrators AINT1 and AINT2, analog adder/subtracters ASi1 and ASi2, a digital/analog conversion circuit DACi, and a plurality of amplifier circuits (α1, α2, β1). To the analog integrator AINT1, a signal from the analog adder/subtracter AS11 (AS21) of FIG. 2 is input. To the digital/analog converter circuit DACi, the output signal S11 (or the output signal S21) of FIG. 2 is input.

The output signal of the analog integrator AINT1 is multiplied by a predetermined coefficient α1 by the amplifier circuit, and then input to the analog adder/subtracter ASi1. The output signal of the digital/analog converter circuit DACi is multiplied by a predetermined coefficient β1 by the amplifier circuit, and then input to the analog adder/subtracter ASi1. The analog adder/subtracter ASi1 adds the two inputs, and the analog integrator AINT2 integrates this addition result of the analog adder/subtracter ASi1.

The output signal of the analog integrator AINT1 is multiplied by a predetermined coefficient α2 by the amplifier circuit, and then input to the analog adder/subtracter ASi2. The output signal of the analog integrator AINT2 is input to the analog adder/subtracter ASi2. The analog adder/subtracter ASi2 adds the two inputs, and outputs this addition result as an output signal of the analog integrator unit INTU.

In addition, the input signal (for example, the external input signal SI of FIG. 2) of the modulator is multiplied by a predetermined coefficient α3 by the amplifier circuit, and then input to the analog adder/subtracter ASi2. Various configurations are known for the analog integrator unit, and any of the various configurations is applicable, without limiting the configuration of FIG. 3. The number of degrees in the analog integrator unit INTU is not limited to two, and may be three or greater, and may also be one in some case.

Figure 4A:
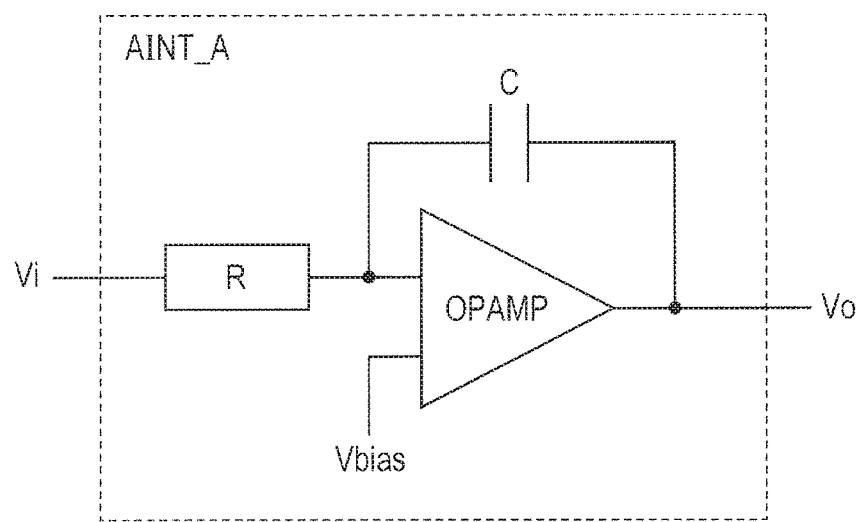
FIG. 4A is a circuit diagram illustrating a schematic configuration example of an analog integrator in the analog integrator unit of FIG. 3.
Figure 4B:
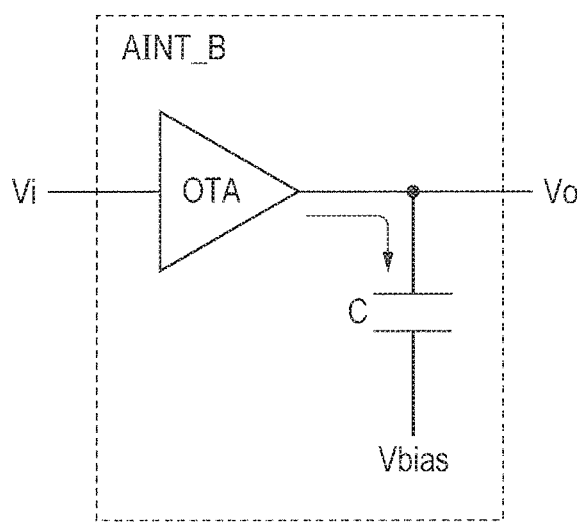
FIG. 4B is a circuit diagram illustrating a schematic configuration example of an analog integrator different from that of FIG. 4A.

FIG. 4A is a circuit diagram illustrating a schematic configuration example of an analog integrator in the analog integrator unit of FIG. 3, and FIG. 4B is a circuit diagram illustrating a schematic configuration example of an analog integrator which differs from that of FIG. 4A. The analog integrators of FIG. 4A and FIG. 4B are continuous-time integrators. The analog integrator AINT_A of FIG. 4A is an RC type integrator which includes a resistor R, a capacitor C, and an operational amplifier OPAMP. In fact, it is often configured in the form of a differential type, rather than this single-end type. An input signal Vi is converted to a current by the resistor R, and the charges of the current are accumulated in the capacitor C. As a result, an integration result of the input signal Vi can be obtained as an output signal Vo.

When the gain and band of the operational amplifier are both infinite, the analog integrator AINT_A is an ideal integrator. Note that the actual operational amplifier OPAMP has a finite gain and a finite band. In fact, the characteristic of the resistor R or the capacitor C varies from the ideal characteristic in accordance with the manufacturing variation. As a result, as illustrated in FIG. 20, the actual transfer functions $H_{1A\_R}$ (f) and $H_{2A\_R}$ (f) differ from the transfer functions $H_{1A}$ (f) and $H_{2A}$ (f) in the ideal state. Using the configuration example of FIG. 2, it is possible to search for the actual transfer functions $H_{1A\_R}$ (f) and $H_{2A\_R}$ (f) including the finite gain and the finite band of this operational amplifier OPAMP. This results in relaxing the request for the performance of the operational amplifier, and thus may result in attaining a reduction (power saving) in the operating current.

An analog integrator AINT_B of FIG. 4B is a current amplifier type integrator including a current amplifier (gm amplifier) OTA and a capacitor C. In fact, it often may be configured as a differential type, rather than this single-end type. An input signal Vi is converted into a current based on transconductance gm of the current amplifier OTA, and the charges of the current are accumulated in the capacitor C. As a result, an accumulation result of the input signal Vi is obtained as an output signal Vo. In general, in the current amplifier type, the linearity is deteriorated, though the current is more reduced than that in the RC type.

Figure 5:
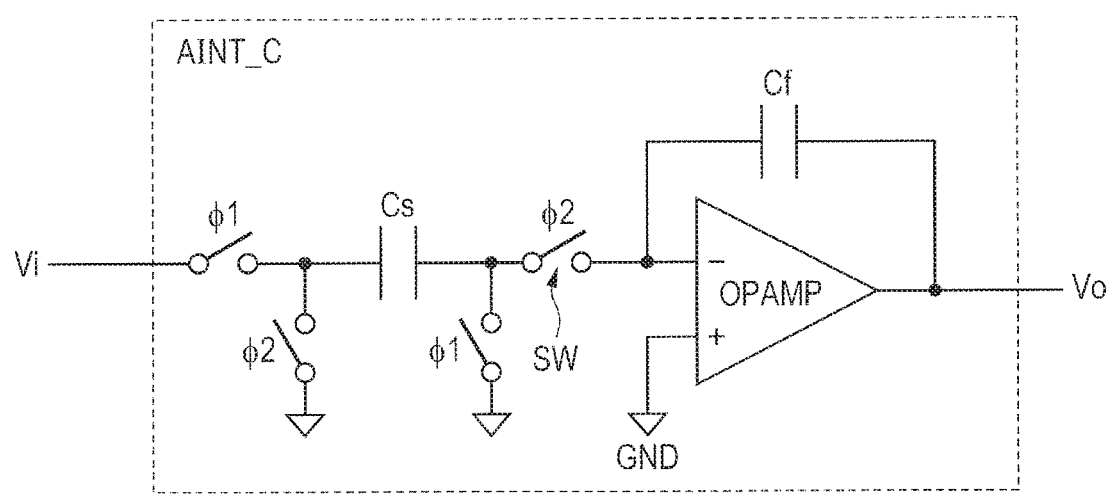
FIG. 5 is a circuit diagram illustrating another schematic configuration example of the analog integrator in the analog integrator unit of FIG. 3.

FIG. 5 is a circuit diagram illustrating anther schematic configuration example of an analog integrator in the analog integrator unit of FIG. 3. An analog integrator AINT_C of FIG. 5 is configured with a switched capacitor, and is a discrete-time type integrator. In fact, it is often configured as a differential type integrator, rather than this single-end type one. This analog integrator AINT_C includes two switches SW controlled by a sampling clock Φ1, two switches SW controlled by an inversion sampling clock Φ2, a sampling capacitor Cs, a feedback capacitor Cf, and an operational amplifier OPAMP. The input signal Vi is sampled by the sampling capacitor Cs in accordance with a sampling clock Φ1, and transferred to the feedback capacitor Cf by the inversion sampling clock Φ2. As a result, an integration result of the input signal Vi is obtained as an output signal Vo.

If the gain of the operational amplifier OPAMP is infinite, and if the excessive response to the output signal Vo is converged at every sampling cycle, the analog integrator AINT_C is an ideal integrator. The latter case can be guaranteed by controlling a sufficient current to flow through, for example, the operational amplifier OPAMP. In the former case, the actual operational amplifier OPAMP has a finite gain. As a result, as illustrated in FIG. 20, the actual transfer functions $H_{1A\_R}$ (f) and $H_{2A\_R}$ (f) differ from the transfer functions $H_{2A}$ (f) and $H_{2A}$ (f). Using the configuration example of FIG. 2, it is possible to search for the actual transfer functions $H_{1A\_R}$ (f) and $H_{2A\_R}$ (f) including the effect of the finite gain of this operational amplifier OPAMP.

In the MASH type sigma-delta ADC of FIG. 2, the adaptive filters AF1 and AF2 search for the transfer functions $H_{1A\_R}$ (f) and $H_{2A\_R}$ (f) based on a "z" function. When the discrete-time type integrator of FIG. 5 is used for the analog integrator units INTU1 and INTU2, the transfer functions $H_{1A\_R}$ (f) and $H_{2A\_R}$ (f) can be defined based on the "z" function. Thus, it is possible to transfer functions $H_{1A\_R}$ (f) and $H_{2A\_R}$ (f) can be searched by the adaptive filters AF1 and AF2.

When the continuous-time type integrator of FIG. 4A and FIG. 4B is used for the analog integrator units INTU1 and INTU2, strictly speaking, the transfer functions $H_{1A\_R}$ (f) and $H_{2A\_R}$ (f) are Laplace functions ("s" functions). Thus, the adaptive filters AF1 and AF2 search for any transfer function which has been obtained by converting the Laplace function into a "z" function. As a result of this search, transfer functions which somehow deviates from the transfer functions $H_{1A\_R}$ (f) and $H_{2A\_R}$ (f) may be obtained. Even though this difference exists, the transfer functions $H_{1A\_R}$ (f) and $H_{2A\_R}$ (f) can still uniquely be searched by the adaptive filters AF1 and AF2.

Details of Analog Adder/Subtracter

Figure 6:
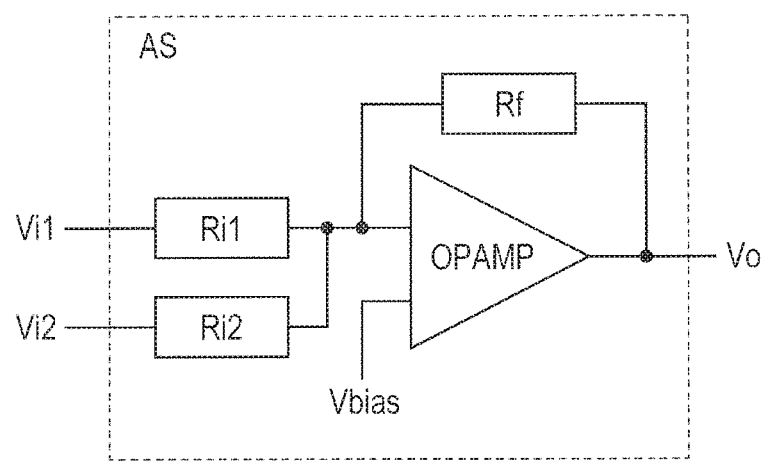
FIG. 6 is a circuit block diagram illustrating a configuration example of an analog adder/subtracter in FIG. 2.

FIG. 6 is a circuit block diagram illustrating a configuration example of an analog adder/subtracter of FIG. 2. An analog adder/subtracter AS illustrated in FIG. 6 includes input resistors Ri1 and Ri2, a feedback resistor Rf, and an operational amplifier OPAMP. The input signals (voltage signals) Vi1 and Vi2 are converted into currents by the input resistors Ri1 and Ri2, and the total current is converted into a voltage by the feedback resistor Rf. As a result, an addition result of the input signals Vi1 and Vi2 is obtained as an output signal Vo. In fact, it is often configured as a differential type, rather than a single-end type. In this case, a reversed polarity input signal (−Vi2) exists, and is used to perform subtraction.

When the gain and the band of the operational amplifier OPAMP are both infinite, the corresponding analog adder/subtracter AS is an ideal adder/subtracter. The output signal Vo is obtained by equation (1), in which weight of addition is set with the resistance values of the input resistors Ri1 and Ri2. However, the operational amplifier OPAMP has in fact a finite gain and a finite band. As a result, like the case of FIG. 20, the actual transfer functions $H_{1A\_R}$ (f) and $H_{2A\_R}$ (f) may differ from the transfer functions $H_{1A}$ (f) and $H_{2A}$ (f) in the ideal state, with using this analog adder/subtracter AS. Using the configuration example of FIG. 2, it is possible to search for the actual transfer functions $H_{1A\_R}$ (f) and $H_{2A\_R}$ (f) including the effect of the finite gain and the finite band of the operational amplifier OPAMP in the analog adder/subtracter AS.

$$Vo = -(Rf/Ri1) \cdot Vi1 - (Rf/Ri2) \cdot Vi2 \qquad (1)$$

If the feedback resistor Rf is replaced by a feedback capacitance, addition and subtraction can be realized by one operational amplifier OPAMP. That is, by this configuration, it is possible to realize the analog adder/subtracter AS11 and the analog integrator unit INTU1 of FIG. 2, or the analog adder/subtracter A21 and the analog integrator unit INTU2. It is also possible to use a passive adder and subtracter configured with a resistance element and a capacitance element, without using the operational amplifier OPAMP. In this case, the gain<1. Thus, it is necessary to compensate for the gain using another circuit block. Further, it is possible to configure the discrete-time type adder/subtracter or the discrete-time type adder/subtracter and integrator, using the switched capacitor.

Details of Adaptive Filter

Figure 7A:
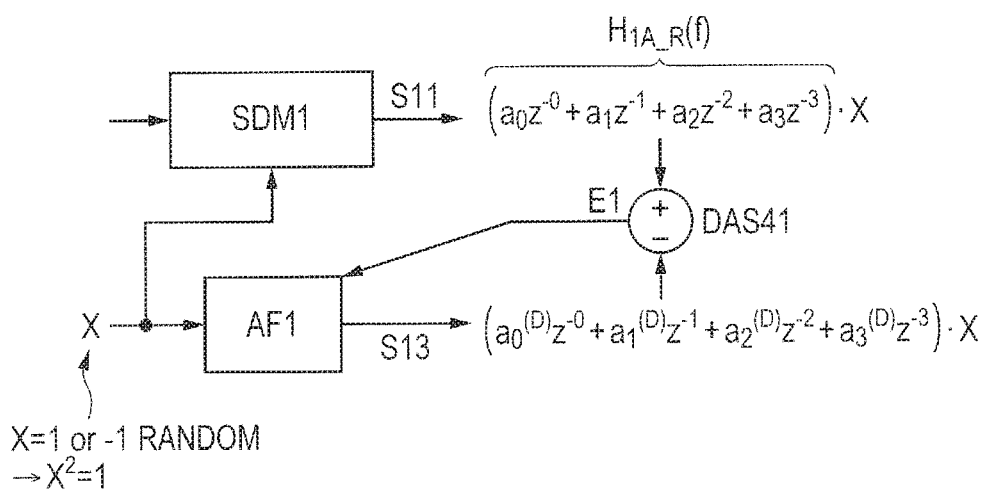
FIG. 7A and FIG. 7B are explanatory diagrams illustrating an operation example of an adaptive filter in FIG. 2.
Figure 7B:
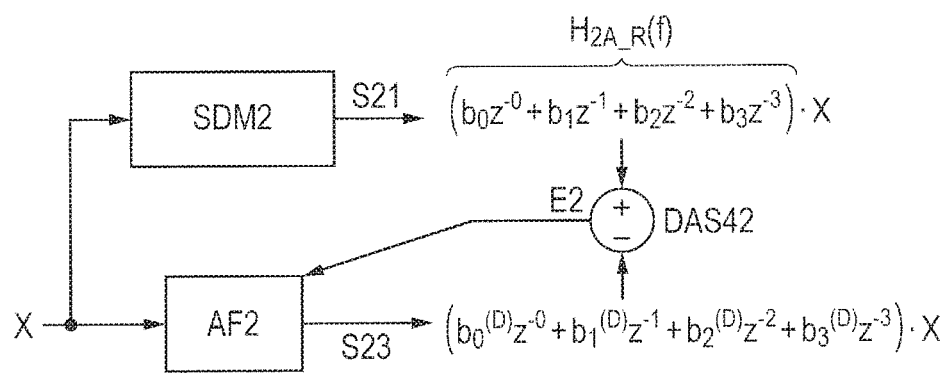
Figure 8:
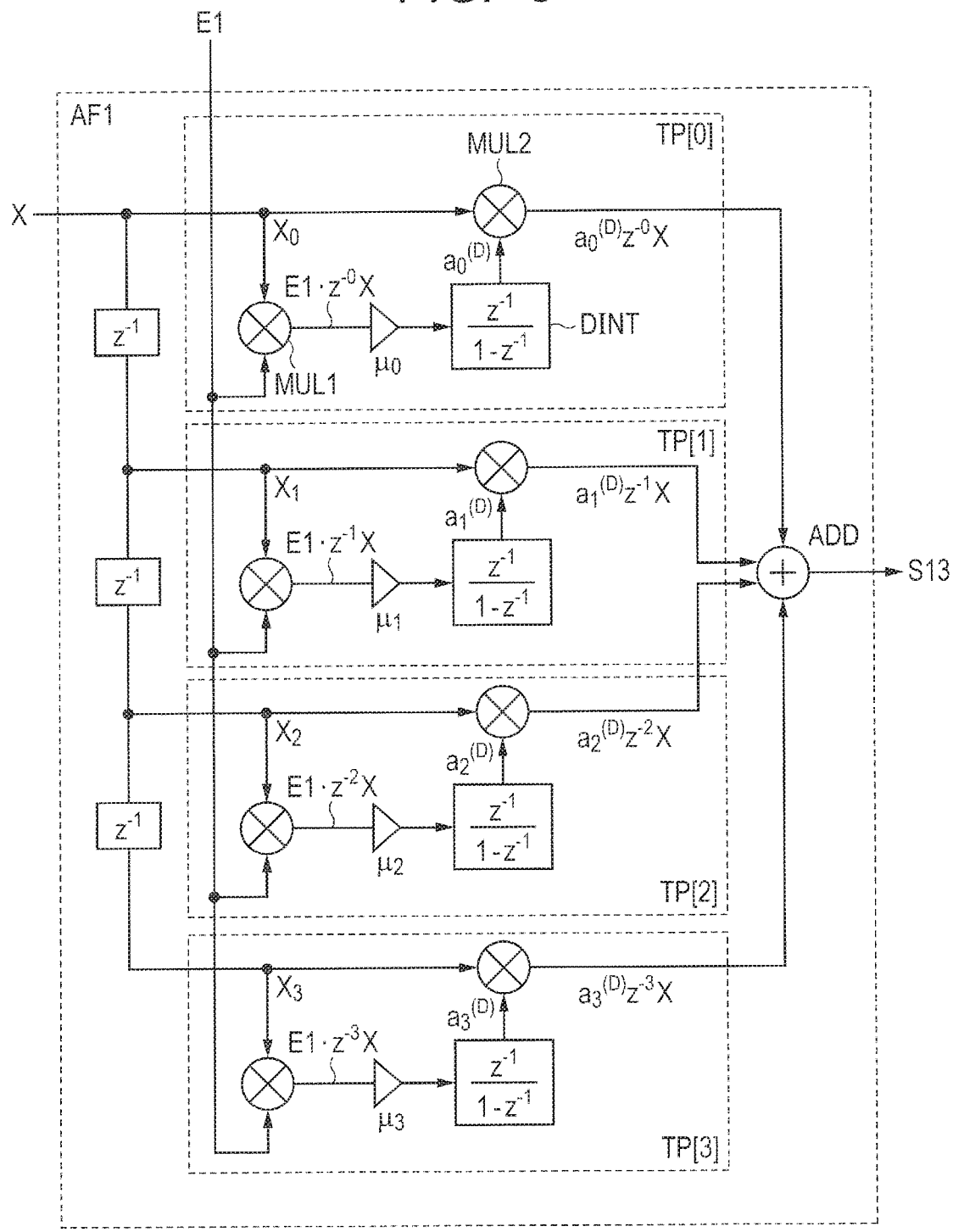
FIG. 8 is a block diagram illustrating a configuration example of the adaptive filter in FIG. 2.

FIG. 7A and FIG. 7B are explanatory diagrams illustrating an operation example of the adaptive filter in FIG. 2. FIG. 8 is a block diagram illustrating a configuration example of the adaptive filter of FIG. 2. In FIG. 7A, the adaptive filter AF1 searches for its own filter coefficient (a tap coefficient) for making an error signal E1 approximate to zero using an LMS algorithm, based on the error signal E1 as an error between an output signal S11 of the modulator SDM1 (quantizer QT1) in accordance with a probe signal X and its own output signal S13. Specifically, the output signal S11 in accordance with the probe signal X of the modulator SDM1 is "$H_{1A\_R}$ (f)·X", and the transfer function $H_{1A\_R}$ (f) can be expressed by "$a_0 z^{-0} + a_1 z^{-1} + a_2 z^{-2} + a_3 z^{-3}$". The output signal S13 of the adaptive filter AF1 can be expressed by "$a_0^{(D)} z^{+0} + a_D^{(D)} z^{-1} + a_2^{(D)} z^{-2} + a_3^{(D)} z^{-3}$". The adaptive filter AF1 searches for "$a_D^{(D)}$", "$a_1^{(D)}$", "$a_2^{(D)}$", and "$a_3^{(D)}$" satisfying "$a_0 = a_0^{(D)}$", "$a_1 = a_1^{(D)}$", "$a_2 = a_2^{(D)}$", "$a_3 = a_3^{(D)}$".

Similarly, in FIG. 7B, the adaptive filter AF2 searches for its own tap coefficient in a manner that the error signal E2 is made approximate to zero using the LMS algorithm, based on the error signal E2 as an error between the output signal S21 of the modulator SDM2 (the quantizer QT2) in accordance with the probe signal X and its own output signal S23. Specifically, the output signal S21 in accordance with the probe signal X of the modulator SDM2 is "$H_{2A\_R}$ (f)·X, and the transfer function $H_{2A\_R}$ (f) can be expressed by "$b_0 z^- + b_1 z^{-1} + b_2 z^{-2} + b_3 z^{-3}$". The output signal S23 of the adaptive filter AF2 is "$b_0^{(D)} z^{-0} + b_1^{(D)} z^{-1} + b_2^{(D)} z^{-2} + b_3^{(D)} z^{-3}$". The adaptive filter AF2 searches for $b_0^{(D)}$, $b_1^{(D)}$, $b_2^{(D)}$, $b_3^{(D)}$, satisfying "$b_0 = b_0^{(D)}$", "$b_1 = b_1^{(D)}$", "$b_2 = b_2^{(D)}$", and "$b_3 = b_3^{(D)}$".

FIG. 8 illustrates a configuration example of the adaptive filter AF1 of FIG. 7A. This configuration is applied also to the adaptive filter AF2 of FIG. 7B. The adaptive filter AF1 of FIG. 8 includes a plurality of (in this case, four) tap circuits TP [0] to TP [3] and a digital adder ADD which adds output signals of the tap circuits TP [0] to TP [3]. A tap circuit TP [k] (k=0, 1, 2, 3) includes digital multipliers MUL1 and MUL2, and a digital integrator DINT.

The digital multiplier MUL1 multiplies the error signal E1 by a delay probe signal $X_k$. The digital integrator DINT integrates a value which has been obtained by multiplying a multiplication result of the digital multiplier MUL1 by a predetermined step coefficient $\mu_k$. The digital multiplier MUL2 multiplies an integration result ($a_k^{(D)}$) of the digital integrator DINT by the delay probe signal $X_k$, and outputs this multiplications result to the digital adder ADD. The delay probe signal $X_k$ are signals, which differ between the tap circuits TP [k] and are obtained by delaying the probe signal X by degrees ($z^{-k}$) different between the tap circuits TP [k]. That is, delay probe signals $X_0$, $X_1$, $X_2$, and $X_3$ of the tap circuits TP [0], TP [1], TP [2], and TP [3] are respectively $z^{-0} \cdot X$, $z^{-1} \cdot X$, $z^{-2} \cdot X$, $z^{-3} \cdot X$.

Descriptions will now be made to an operation with the tap circuit TP [0] by way of example. This also applies to other tap circuits TP [1], TP [2], and TP [3]. The error signal E1 is expressed by Equation (2). As expressed in Equation (3), the digital multiplier MUL1 obtains correlation between the error signal E1 and the delay probe signal X0 ($=z^{-0} \cdot X$), for each cycle, thereby calculating a defect amount ($a_0 - a_0^{(D)}$) for a target tap coefficient "$a_0$" of $z^{-0} \cdot X$. By multiplying the defect amount by a step coefficient $p_0$, it is possible to obtain an update amount "$\mu_D(a_0 - a_0^{(D)})$" for causing the tap coefficient $a_0^{(D)}$ to approximate to the target tap coefficient $a_0$.

[Equation 1]

$$E1 = (a_0 z^{-0} + a_1 z^{-1} + a_2 z^{-2} + a_3 z^{-3}) \cdot X - \quad (2)$$
$$(a_0^{(D)} z^{-0} + a_1^{(D)} z^{-1} + a_2^{(D)} z^{-2} + a_3^{(D)} z^{-3}) \cdot X = (a_0 - a_0^{(D)}) \cdot z^{-0} X +$$
$$(a_1 - a_1^{(D)}) \cdot z^{-1} X + (a_2 - a_2^{(D)}) \cdot z^{-2} X + (a_3 - a_3^{(D)}) \cdot z^{-3} X$$

[Equation 2]

$$E1 \cdot z^{-0} X = (a_0 - a_0^{(D)}) + (a_1 - a_1^{(D)}) \cdot z^{-1} X \cdot z^{-0} X + \quad (3)$$
$$(a_2 - a_2^{(D)}) \cdot z^{-2} X \cdot z^{-0} X + (a_3 - a_3^{(D)}) \cdot z^{-3} X \cdot z^{-0} X \approx (a_0 - a_0^{(D)})$$

The digital integrator DINT integrates the update amount "$\mu_0 (a_0 - a_0^{(D)})$" for each cycle. As a result, the update amount "$\mu_0 (a_0 - a_0^{(D)})$" is sequentially made approximate to zero. When it is converged to zero, the digital integrator DINT outputs an integration result (that is, a tap coefficient $a_0^{(D)}$) which is equal to the target tap coefficient $a_0$. In the tap circuits TP [1], TP [2], and TP [3] as well, when the update amount is converged to zero, the digital integrators DINT output respectively integration results (the tap coefficients $a_1^{(D)}$, $a_2^{(D)}$, $a_3^{(D)}$) which are equal to the target tap coefficients $a_1$, $a_2$, and $a_3$. To the noise cancel filter NCF2 (for example, a FIR filter or IIR filter) of FIG. 2, the tap coefficients $a_0^{(D)}$, $a_1^{(D)}$, $a_2^{(D)}$, $a_3^{(D)}$ are reflected.

As illustrated in Equation (3), the update amount of the tap circuit TP [0] includes values of other terms (for example, "$a_1 - a_1^{(D)} \cdot z^{-1} X \cdot z^{-0} X$") excluding "$a_0 - a_0^{(D)}$". For the values of these other terms, the delay probe signals (for example, $z^{-0} X$ and $z^{-1} X$) are uncorrelated to each other. Thus, the integration result of the digital integrator DINT, corresponding to the values of the other terms, will be zero. Therefore, the effect of the values of the other terms corresponding to the update amount is ignorable, and the update amount can be assumed as "$\mu_0 (a_0 - a_0^{(D)})$". As expressed in Equation (4), Equation (5), and Equation (6), the same applies to the update amount of each of the other tap circuits TP [1], TP [2], and TP [3]. For example, the update amount in the tap circuit TP [1] can be assumed as "$\mu_1 (a_1 - a_1^{(D)})$".

[Equation 3]

$$E1 \cdot z^{-1} X = (a_1 - a_1^{(D)}) + (a_0 - a_0^{(D)}) \cdot z^{-0} X \cdot z^{-1} X + \quad (4)$$
$$(a_2 - a_2^{(D)}) \cdot z^{-2} X \cdot z^{-1} X + (a_3 - a_3^{(D)}) \cdot z^{-3} X \cdot z^{-1} X \approx (a_1 - a_1^{(D)})$$

[Equation 4]

$$E1 \cdot z^{-2} X = (a_2 - a_2^{(D)}) + (a_0 - a_0^{(D)}) \cdot z^{-0} X \cdot z^{-2} X + \quad (5)$$
$$(a_1 - a_1^{(D)}) \cdot z^{-1} X \cdot z^{-2} X + (a_3 - a_3^{(D)}) \cdot z^{-3} X \cdot z^{-2} X \approx (a_2 - a_2^{(D)})$$

[Equation 5]

$$E1 \cdot z^{-3} X = (a_3 - a_3^{(D)}) + (a_0 - a_0^{(D)}) \cdot z^{-0} X \cdot z^{-3} X + \quad (6)$$
$$(a_1 - a_1^{(D)}) \cdot z^{-1} X \cdot z^{-3} X + (a_2 - a_2^{(D)}) \cdot z^{-2} X \cdot z^{-3} X \approx (a_3 - a_3^{(D)})$$

For example, the output signal S11 of the modulator SDM1 in FIG. 7A in fact includes a component of a quantization error $Q_1$ and a component of an external input signal S1. These components are also included in the error signal E1 of Equation (2). Note that the probe signal X and the quantization error $Q_1$ are not correlated with each other, and the probe signal X and the external input signal SI are also not correlated with each other. Thus, like the case of the above-described values of the other terms, the integration results of the digital integrator DINT for the component of the quantization error $Q_1$ and for the component of the external input signal SI are zero, and the effect of these components for the update amount is ignorable. As a result, as illustrated in FIG. 2, the component of the quantization error $Q_1$ and the component of the external input signal SI in the output signal S11 are ignorable from the viewpoint of the input signal for the adaptive filter AF1 through the digital adder/subtracter DAS41.

In this manner, in the embodiment 1, it is assumed that the probe signal X is not correlated with the quantization error $Q_1$ or the external input signal SI, and that the delay probe signals X0, X1, X2, and X3 are also not correlated with each other. Thus, the probe signal X is preferably a pseudo random signal. The probe signal X is preferably a pseudo random signal, from the viewpoint of performing the search by the adaptive filters AF1 and AF2 using the probe signal X with various frequency components.

The probe signal X is more preferably a 1-bit (binary value) pseudo random signal. If it is a 1-bit (binary value) signal, it is possible to reduce the characteristic variation of the digital/analog converter circuit DAC13 of FIG. 2, as compared to the case of a 2-(or greater) bit (quaternary value) signal. Specifically, the digital/analog converter circuit DAC13 generates "+X*Vref(V)" in accordance with an input of, for example, "+XA", and inverts "+X*Vref(V)" in accordance with an input of "−X", thereby enabling to generate "−X*Vref(V)". Thus, it is possible to uniformly keep a voltage amplitude in accordance with "±X".

Scheme of Analog/Digital Converter (Modification)

Figure 9:
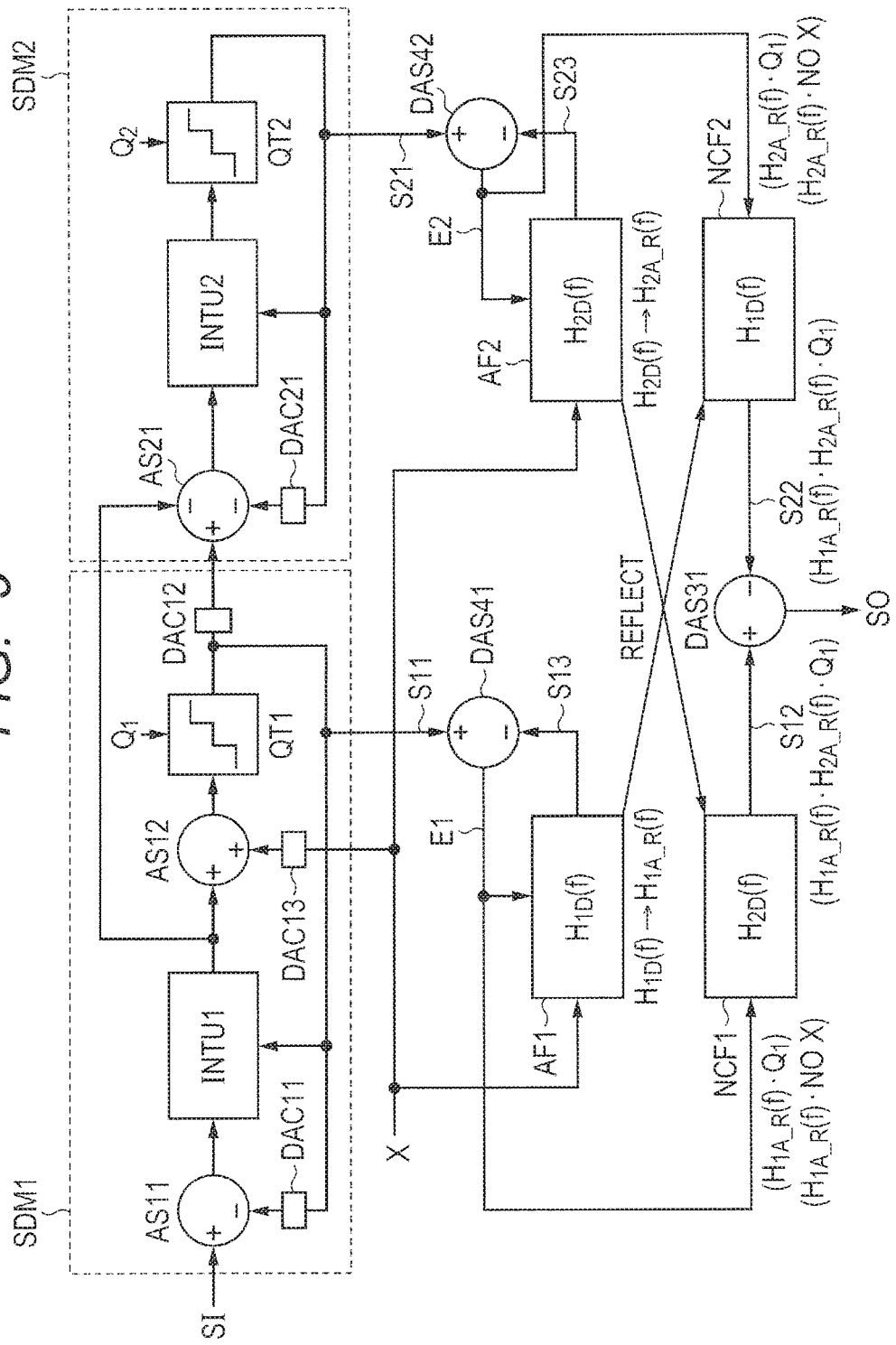
FIG. 9 is a circuit block diagram illustrating a schematic configuration example and an operation example of modifying the analog/digital converter of FIG. 2.

FIG. 9 is a circuit block diagram illustrating a schematic configuration example and an operation example of modifying the analog/digital converter of FIG. 2. As compared with the analog/digital converter of FIG. 2, in the analog/digital converter illustrated in FIG. 9, the input signal of the noise cancel filter NCF1 is the error signal E1, and the input of the noise cancel filter NCF2 is the error signal E2. In the case of the configuration example of FIG. 2, the input signal S11 of the noise cancel filter NCF1 includes a component of "$H_{1A\_R}$ (f)·X", and the input signal S21 of the noise cancel filter NCF2 includes a component of "$H_{2A\_R}$ (f)·". Like the quantization error $Q_1$, these components are canceled by the digital adder/subtracter DAS31.

In the case of the configuration example of FIG. 9, the error signal E1 as an input signal of the noise cancel filter NCF1 does not include the component of "$H_{1A\_R}$ (f)·X" in accordance with the operation of the adaptive filter AF1, and the error signal E2 as an input signal of the noise cancel filter NCF2 does not include the component of "$H_{2A\_R}$ (f)·X" in accordance with the operation of the adaptive filter AF2. There is no difference between FIG. 2 and FIG. 9 on the point that an output signal (that is, the component of the external input signal SI and the component of the quantization error $Q_1$) of the modulator SDM1 (the quantizer QT1) is input directly or indirectly to the noise cancel filter NCF1. Similarly, there is no difference between FIG. 2 and FIG. 9 on the point that output signals (that is, the component of the quantization error $Q_1$ and the component of the quantization error $Q_2$) of the modulator SDM2 (the quantizer QT2) are input directly or indirectly to the noise cancel filter NCF2.

Main Effect of Embodiment 1

Accordingly, using the method of the embodiment 1, even if the characteristic variation occurs in the analog integrator, the quantization error $Q_1$ can be canceled, and it is possible to realize the analog/digital converter with a high resolution. At this time, unlike the method of the comparative example of FIG. 21, output signals of the respective modulators SDM1 and SDM2 are observed, thereby enabling to adjust one noise cancel filter based on one observation result. As a result, the adjustment process is simplified, thereby enabling to easily obtain the solution and to increase the accuracy of the solution (in other words, the searching accuracy of the adaptive filters AF1 and AF2).

It is possible to adjust the noise cancel filters NCF1 and NCF2 with reflecting not only the characteristic variation of the analog integrator, but also the characteristic variation of any of various circuits (for example, the characteristic variation of the analog adder/subtracter, and the characteristic variation in accordance with mismatching of a reference voltage between the quantizer and the digital/analog converter circuit). Further, unlike the method of the comparative example of FIG. 21, it is possible to perform a search operation of the adaptive filters AF1 and AF2, parallelly (that is, in the background) while A/D conversion is performed for the external input signal SI. As a result, for example, even when a characteristic change of various circuits occurs due to a change in the use environment, it can be reflected as soon as possible to the noise cancel filters NCF1 and NCF2. As a result of these, it is possible to realize the analog/digital converter with a high resolution.

Embodiment 2

Figure 10:
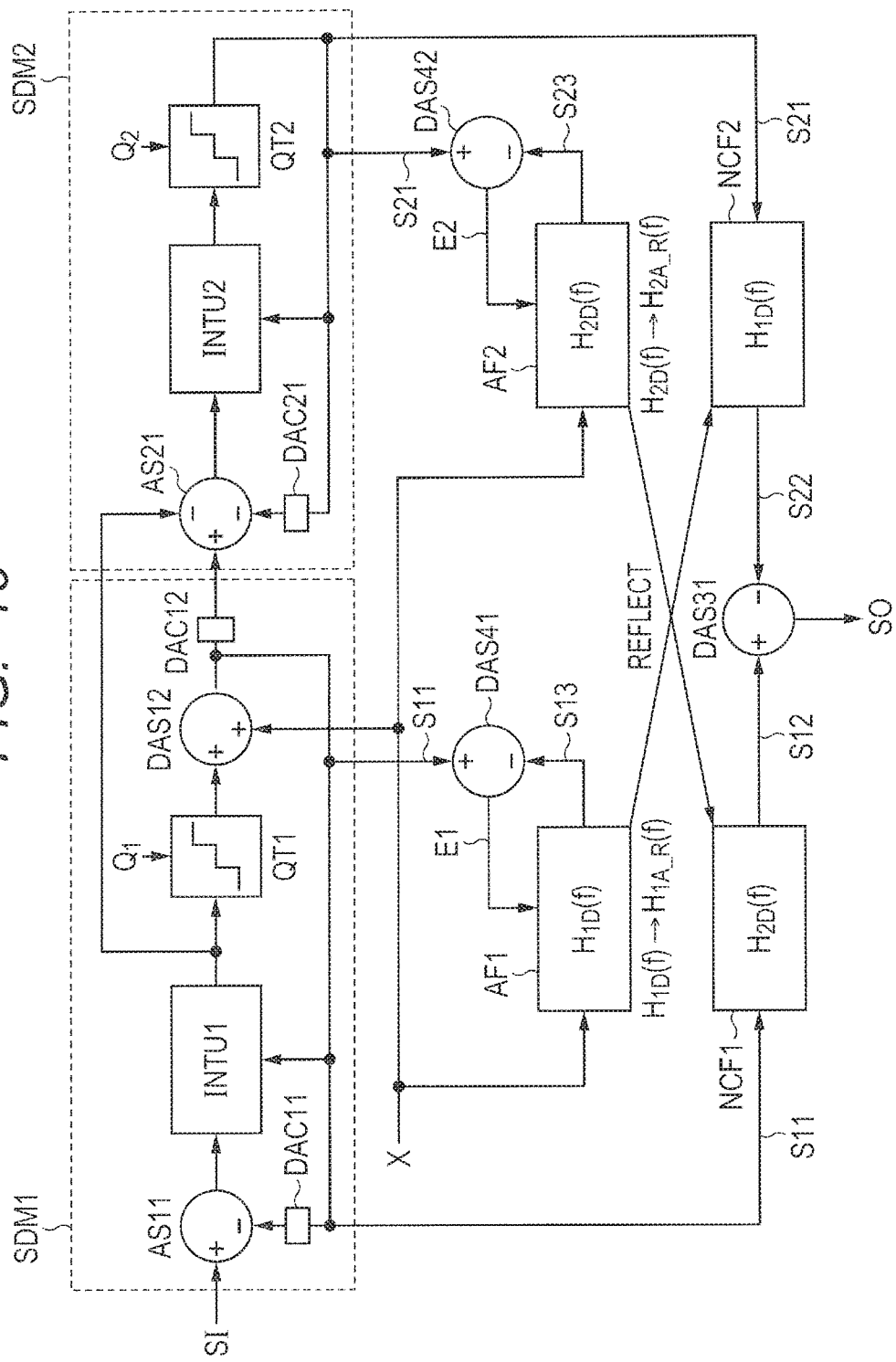
FIG. 10 is a block diagram illustrating a schematic configuration example and an operation example of the main part of an analog/digital converter according to an embodiment 2 of the present invention.

FIG. 10 is a circuit block diagram illustrating a schematic configuration example and an operation example of the main part of the analog/digital converter according to an embodiment 2 of the present invention. As compared with the configuration example of FIG. 2, in the MASH type sigma-delta ADC illustrated in FIG. 10, the digital/analog converter circuit DAC13 in the modulator SDM1 and the analog adder/subtracter AS12 are replaced by the digital adder/subtracter DAS12. As a result, the probe signal X is injected to an output signal of the quantizer QT1 through the digital adder/subtracter DAS12. That is, the difference between the configuration example of FIG. 2 and the configuration example of FIG. 10 is that the probe signal X is injected in the form of an analog signal or a digital signal.

Main Effect of Embodiment 2

Using the method of the embodiment 2 as well, the same effects as the various effects of the embodiment 1 can be obtained. Unlike the configuration example of FIG. 2, the analog adder/subtracter AS12 is not necessary. Thus, it is possible to reduce the electricity, and it may be possible to improve the searching accuracy by the adaptive filters AF1 and AF2, because there is no error in the addition value due to the gain insufficiency and the band insufficiency of the analog adder/subtracter AS12. As compared with the configuration example of FIG. 2, a special configuration maybe necessary in the digital/analog converter circuits DAC11 and DAC12. From this viewpoint, the configuration example of FIG. 2 is more preferred.

Particularly, for example, when the quantizer QT1 is configured with 3 bits (octal value), the output signal of the quantizer QT1 has a signal sequence of $-1, -\frac{3}{4}, -\frac{1}{2}, -\frac{1}{4}, 0, \frac{1}{4}, \frac{1}{2}, \frac{3}{4}, 1$. When the probe signal X is assumed as, for example, a ($\pm 0.1$) binary value, the digital/analog converter circuits DAC11 and DAC12 need a configuration corresponding to inputs of digital values, such as 0.85 ($\frac{3}{4}+0.1$), 0.15 ($\frac{1}{4}-0.1$). If the digital values of the probe signal X are the same as the digital value of the quantizer QT1, convergence the searching by the adaptive filters AF1 and AF2 may be decreased.

Embodiment 3

Scheme of Analog/Digital Converter (Embodiment 3)

Figure 11:
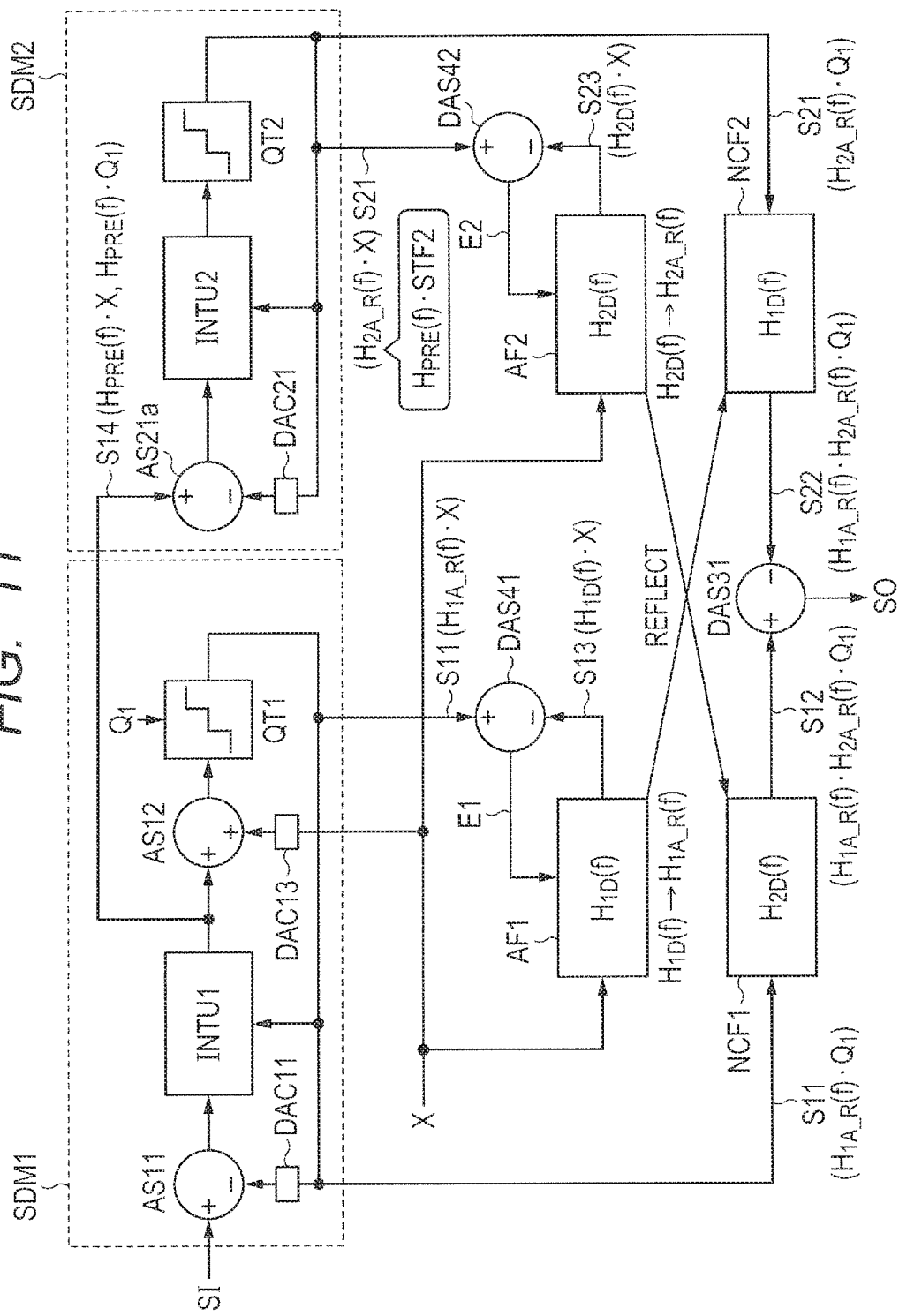
FIG. 11 is a circuit block diagram illustrating a schematic configuration example and an operation example of the main part of an analog/digital converter according to an embodiment 3 of the present invention.

FIG. 11 is a circuit block diagram illustrating a schematic configuration example and an operation example of the main part of an analog/digital converter according to an embodiment 3 of the present invention. As compared with the configuration example of FIG. 2, in the MASH type sigma-delta ADC illustrated in FIG. 11, the analog adder/subtracter AS21 in the modulator SDM2 is replaced by an analog adder/subtracter AS21a, and a signal path for the analog adder/subtracter AS21 through the digital/analog converter circuit DAC12 in the modulator SDM1 is excluded. That is, a signal path from the modulator SDM1 for the analog adder/subtracter AS21a in the modulator SDM2 is only for an output signal of the analog integrator unit INTU1.

For example, depending on an internal configuration of the analog integrator unit INTU illustrated in FIG. 3, it is possible to extract the component of the quantization error $Q_1$ from the output signal of the analog integrator unit INTU1. In this case, an output signal S14 of the analog integrator unit INTU1 includes a component of "$H_{PRE}(f) \cdot Q_1$" and a component of "$H_{PRE}(f) \cdot X$". The transfer function $H_{PRE}(f)$ is a "transfer function from an application point of the quantization error $Q_1$ up to the output signal S14 of the analog integrator unit INTU1".

Unlike the case of the embodiment 1, in accordance with this output signal S14, the transfer function $H_{2A\_R}(f)$ is "$H_{PRE}(f) \cdot STF2$" (STF2 is a signal transfer function of the modulator SDM2). The adaptive filter AF2 searches for this transfer function $H_{2A\_R}(f)$. Strictly speaking, as described above, a difference occurs in the search result, in accordance with whether the continuous-time type integrator of FIG. 4A or FIG. 4B is used for the analog integrator units INTU1 and INTU2, or the discrete-time type integrator of FIG. 5 is used therefor. When any of the integrators is used, still, the transfer function $H_{2A\_R}(f)$ can uniquely be searched by the adaptive filter AF2.

Main Effect of Embodiment 3

Using the method of the embodiment 3, the same effect as any of the various effects of the embodiments 1 can be obtained. Unlike the configuration example of FIG. 2, the digital/analog converter circuit DAC12 is not necessary, thereby enabling to reduce the circuit area. Further, the input (that is, the circuit configuration) for the modulator SDM2 can be flexible. That is, like the case of the embodiment 1, the input for the modulator SDM2 itself is not necessarily the quantization error $Q_1$ or the probe signal X, and the signal maybe obtained by multiplying the quantization error $Q_1$ or the probe signal X by a certain transfer function $H_{PRE}$ (f).

In this case, the adaptive filter AF2 can search for the transfer function $H_{2A\_R}$ (f) as "$H_{PRE}$ (f)·STF2", instead of the signal transfer function (STF2) of the modulator SDM2 in the embodiment 1. In the configuration example of FIG. 2 in the embodiment 1, strictly speaking, the input of the modulator SDM2 may not be the quantization error $Q_1$ or the probe signal X itself. For example, when the continuous-time type integrator is used as the analog integrator unit INTU1, strictly speaking, the input of the modulator SDM2 is a signal which has been obtained by multiplying the quantization error $Q_1$ or the probe signal X by a predetermined transfer function, in accordance with a difference between a discrete signal from the quantizer QT1 and a continuous signal from the analog integrator unit INTU1. In this case also, the adaptive filter AF2 can perform the searching including this predetermined transfer function.

Embodiment 4

Scheme of Analog/Digital Converter (Embodiment 4)

Figure 12:
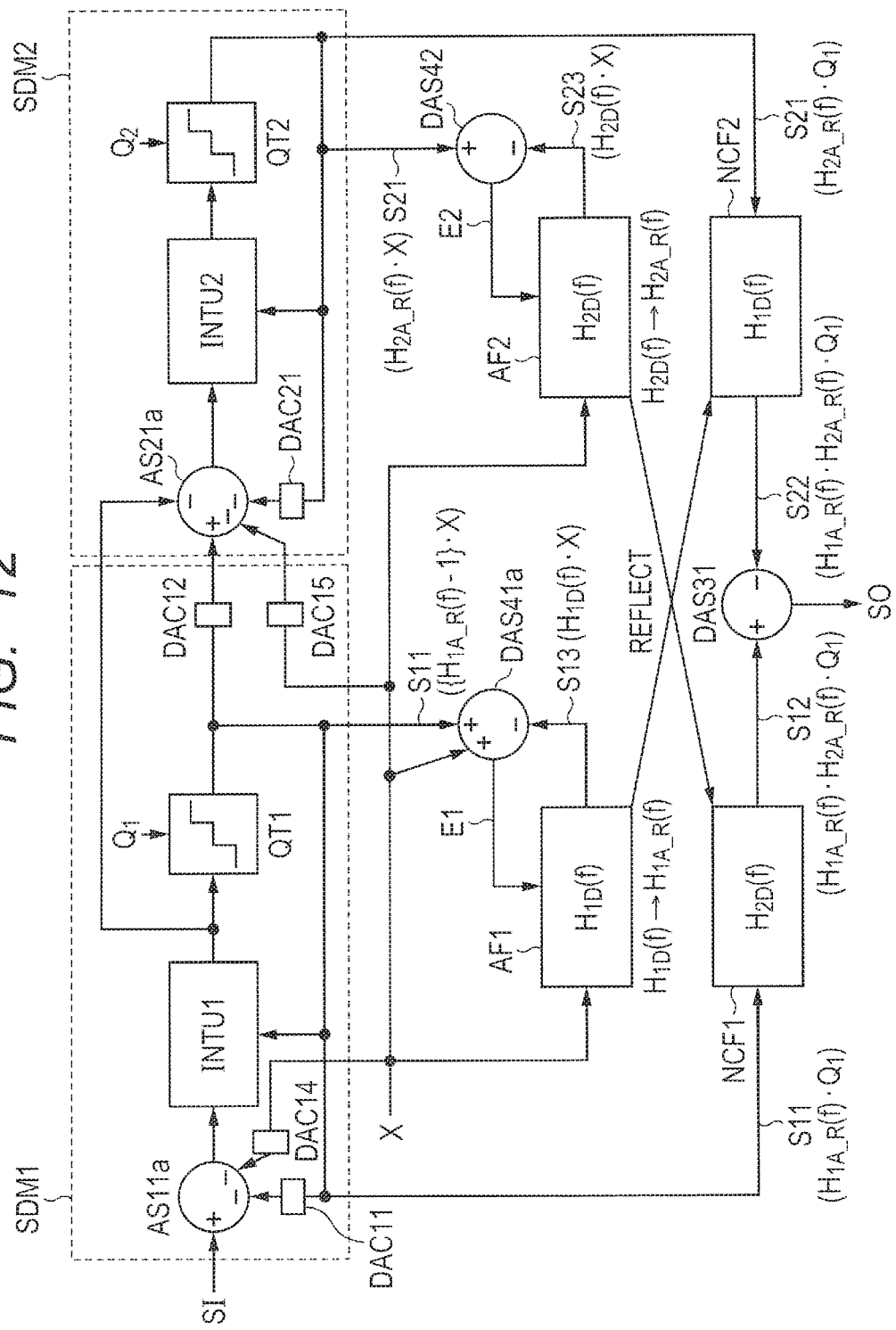
FIG. 12 is a circuit block diagram illustrating a schematic configuration example and an operation example of the main part of an analog/digital converter according to an embodiment 4 of the present invention.

FIG. 12 is a circuit block diagram illustrating a schematic configuration example and an operation example of the main part of an analog/digital converter according to an embodiment 4 of the present invention. The MASH type sigma-delta ADC illustrated in FIG. 12 has the following three different points from the configuration example of FIG. 2. As a first point, the analog adder/subtracter AS11 in the modulator SDM1 is replaced by an analog adder/subtracter AS11a, and the analog adder/subtracter AS21 in the modulator SDM2 is replaced by the analog adder/subtracter AS21a.

As a second point, the analog adder/subtracter AS12 and the digital/analog converter circuit DAC13 are excluded, and instead, digital/analog converter circuits DAC14 and DAC15 with the probe signal X as an input are added. The output signal of the digital/analog converter circuit DAC14 is input to the analog adder/subtracter AS11a, and the output signal of the digital/analog converter circuit DAC15 is input to the analog adder/subtracter AS21a. As a third point, the digital adder/subtracter DAS41 is replaced by the digital adder/subtracter DAS41a. To the digital adder/subtracter DAS41a, the probe signal X is input, in addition to the output signals S11 and S13 like the case of FIG. 2.

Accordingly, in the configuration example of FIG. 12, the probe signal X is injected to the analog adder/subtracter AS11a as an input part of the modulator SDM1 and the analog adder/subtracter AS21a as an input part of the modulator SDM2. Unlike the case of FIG. 2, the output signal S11 of the modulator SDM1 (quantizer QT1) is "$\{H_{1A\_R}$ (f)−1·X$\}$", due to these injection points. "$\{H_{1A\_R}$ (f)−1·X$\}$" is a signal transfer function (SFT1) of the modulator SDM1. The digital adder/subtracter DAS41a adds the probe signal X to this "$\{H_{1A\_R}$ (f)−1·X$\}$", thereby internally generating the same signal "$\{H_{1A\_R}$ (f)·X$\}$" as the case of FIG. 2. Unlike the case of FIG. 2, the probe signal X injected to the analog adder/subtracter AS11a is not transferred to the modulator SDM2. Thus, in the case, the probe signal X is injected also to the analog adder/subtracter AS21a.

Main Effect of Embodiment 4

Using the method of the embodiment 4, the same effects as the various effects described in the embodiment 1 can be obtained. Injection of the probe signal X is performed through the separately provided 1-bit digital/analog converter circuits DAC14 and DAC15. Like the case of FIG. 10 in the embodiment 2, there is no need to prepare a special configuration for the digital/analog converter circuits DAC11 and DAC12, and their original configuration can be used as is. Further, the analog adder/subtracters AS11a and AS21a can be realized by adding an input resistor (corresponding to a non-illustrative Ri3), in FIG. 6, for example. This results in a small area overhead. If there is a gain mismatch between the digital/analog converter circuits DAC14 and DAC15 and the digital/analog converter circuits DAC11 and DAC12, the searching accuracy by the adaptive filters AF1 and AF2 is undesirably decreased. From this viewpoint, the configuration example of FIG. 10 may be more preferred.

Embodiment 5

Scheme of Analog/Digital Converter (Embodiment 5)

Figure 13:
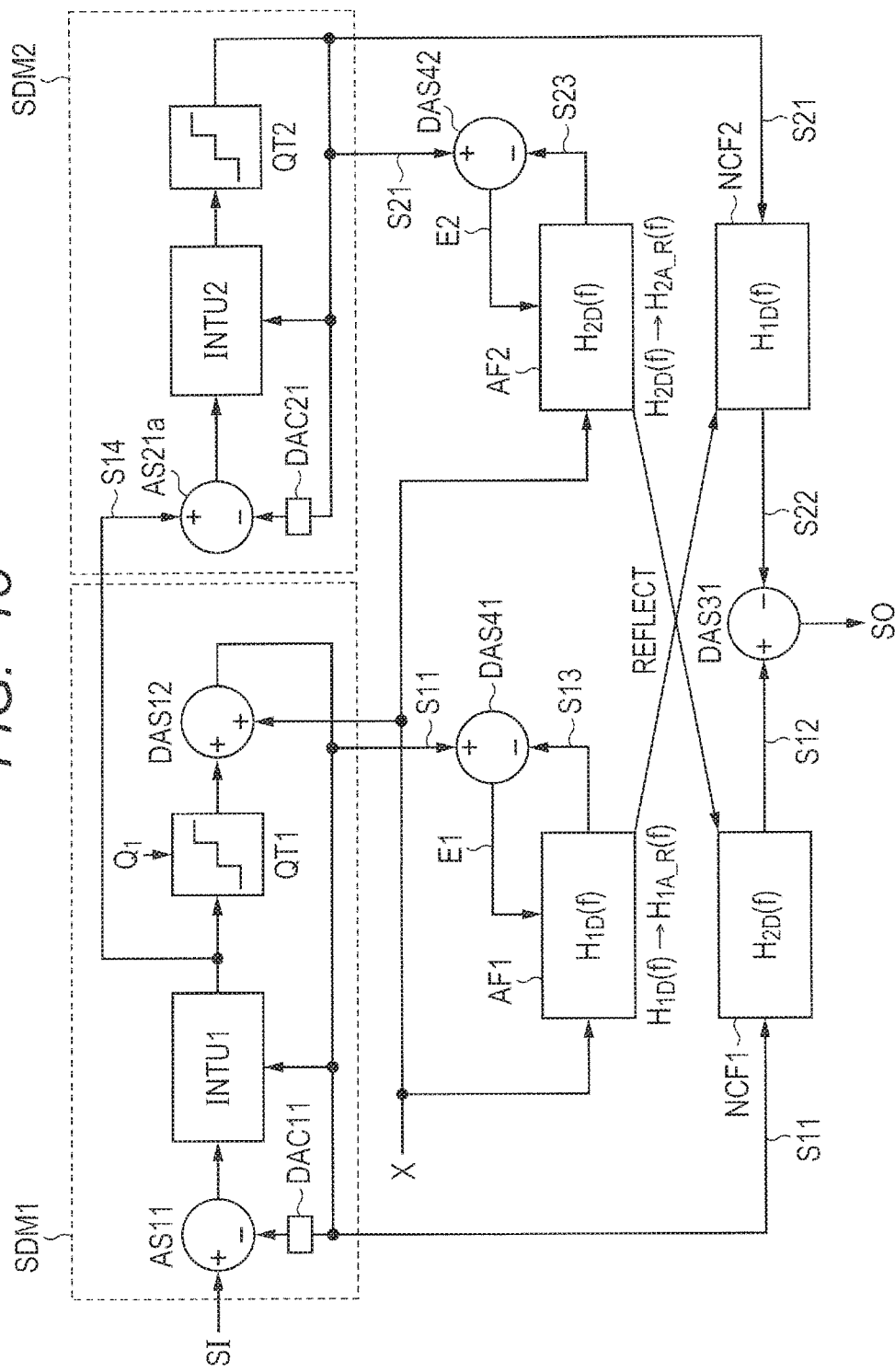
FIG. 13 is a circuit block diagram illustrating a schematic configuration example and an operation example of the main part of an analog/digital converter according to an embodiment 5 of the present invention.

FIG. 13 is a circuit block diagram illustrating a schematic configuration example and an operation example of the main part of an analog/digital converter according to an embodiment 5 of the present invention. The configuration of the MASH type sigma-delta ADC illustrated in FIG. 13 is a combination of the configuration example of FIG. 10 in the embodiment 2 and the configuration example of FIG. 11 in the third embodiment 3. That is, like the case of FIG. 10, the probe signal X is injected to the output signal of the quantizer QT1 through the digital adder/subtracter DAS12. Like the case of FIG. 11, the output signal S14 of the analog integrator unit INTU1 is input to the analog adder/subtracter AS21a of the modulator SDM2.

Main Effect of Embodiment 5

Using the method of an embodiment 5, the same effects as those of the embodiment 2 and the embodiment 3 can be obtained.

Embodiment 6

Scheme of Analog/Digital Converter (Embodiment 6)

Figure 14:
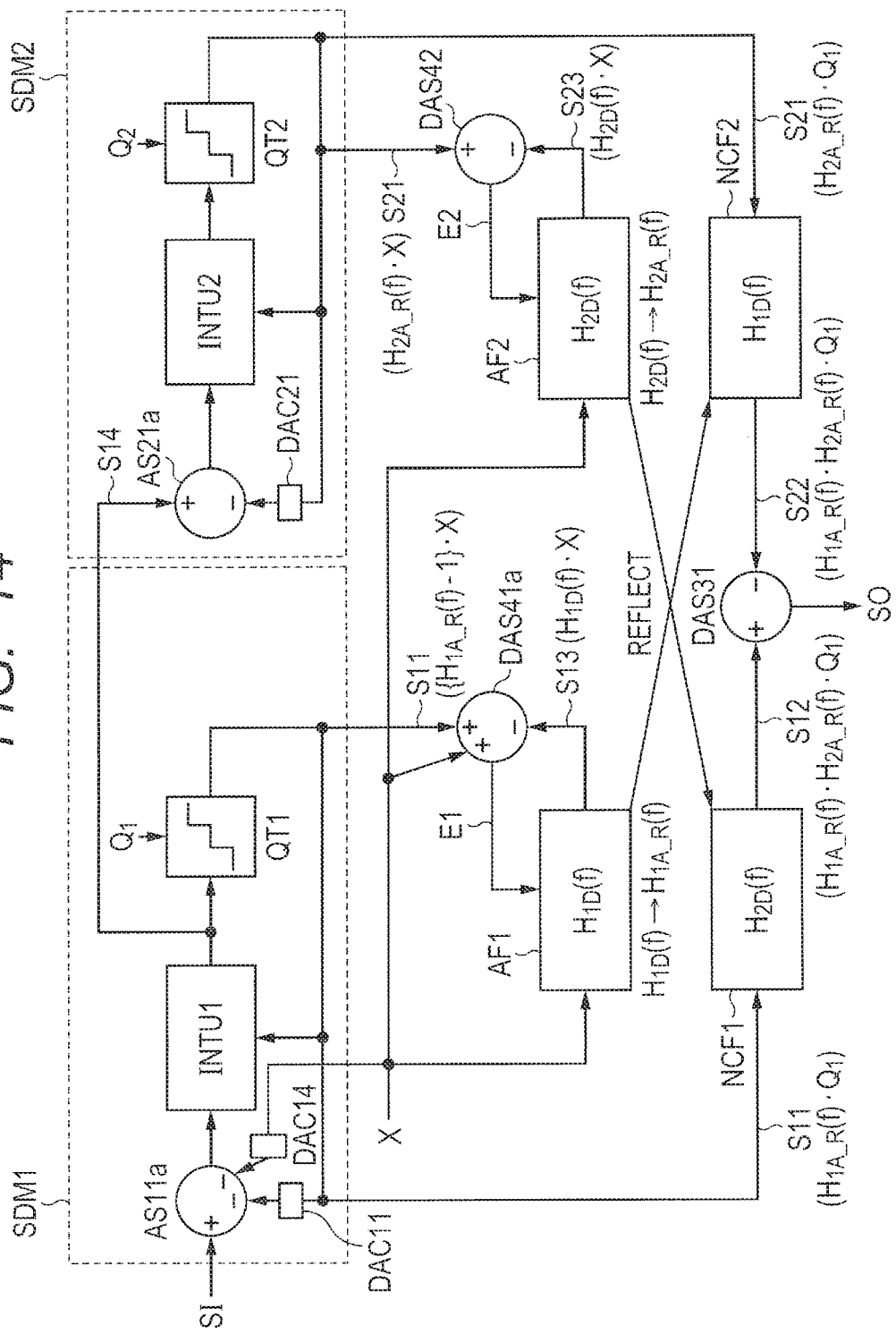
FIG. 14 is a circuit block diagram illustrating a schematic configuration example and an operation example of the main part of an analog/digital converter according to an embodiment 6 of the present invention.

FIG. 14 is a circuit block diagram illustrating a schematic configuration example and an operation example of the main part of an analog/digital converter according to an embodiment 6 of the present invention. The configuration of the MASH type sigma-delta ADC illustrated in FIG. 14 is a combination of the configuration example of FIG. 11 in the embodiment 3 and the configuration example of FIG. 12 in the embodiment 4. That is, like the case of FIG. 11, to the analog adder/subtracter AS21a of the modulator SDM2, the output signal S14 of the analog integrator unit INTU1 is input. Like the case of FIG. 12, the probe signal X is injected to the analog adder/subtracter AS11a in the input part of the modulator SDM1 through the digital/analog converter circuit DAC14. In this case, the output signal S14 includes the component of the probe signal X. Thus, like the case of FIG. 12, there is no need to separately inject the probe signal X to the analog adder/subtracter AS21a in the input part of the modulator SDM2.

Main Effect of Embodiment 6

Using the method of an embodiment 6, the same effects as those of the embodiment 3 and the embodiment 4 can be obtained.

Embodiment 7

Scheme of Analog/Digital Converter (Embodiment 7)

Figure 15:
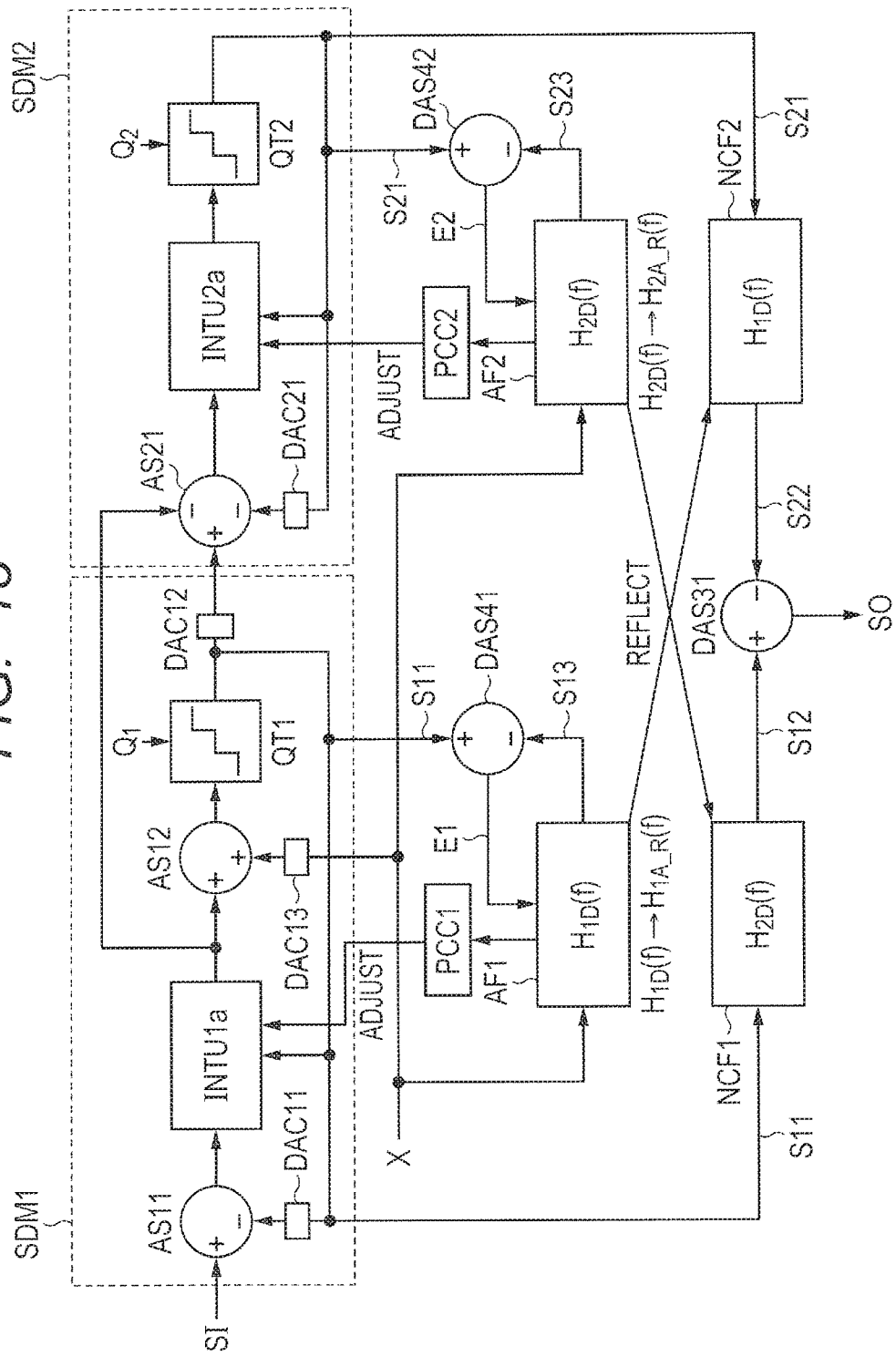
FIG. 15 is a circuit block diagram illustrating a schematic configuration example and an operation example of the main part of an analog/digital converter according to an embodiment 7 of the present invention.

FIG. 15 is a circuit block diagram illustrating a schematic configuration example and an operation example of the main part of an analog/digital converter according to an embodiment 7 of the present invention. As compared with the configuration example of FIG. 2 in the embodiment 1, in the MASH type sigma-delta ADC illustrated in FIG. 15, the analog integrator units INTU1 and INTU2 are replaced respectively by the analog integrator unit INTU1a and INTU2a, and, further, adjustment circuits PCC1 and PCC2 are added thereto.

Each of the analog integrator units INTU1a and INTU2a includes a circuit parameter which can be variably set. Particularly, for example, it may have a configuration in which the resistor R in FIG. 4A is a variable resistor, or a configuration in which a bias current value of the operational amplifier OPAMP is variable. The adjustment circuit PCC1 adjusts the circuit parameter of the analog integrator unit INTU1a based on a search result of the adaptive filter AF1, while the adjustment circuit PCC2 adjusts the circuit parameter of the analog integrator unit INTU2a based on a search result of the adaptive filter AF2.

For example, the transfer function $H_{3D}$ (f) as the search result of the adaptive filter AF1 includes a tap coefficient $a_k^{(D)}$ (k=0, 1, . . . ), as illustrated in FIG. 7A. This tap coefficient $a_k^{(D)}$ is expressed analytically (in a numerical expression) using an RC time constant, the gain and the band of the operational amplifier, included in the analog integrator unit INTU1. Thus, the adjustment circuit PCC1 can perform back calculation for the RC time constant, the gain and band of the operational amplifier through a digital operation, using the value of the tap coefficient $a_k^{(D)}$. Based on this calculation result, it adjusts the RC time constant, the gain and band of the operational amplifier.

After the adjustment, the adaptive filter AF1 may again perform the searching. That is, it may repeat the cycle of "After the adaptive filter AF1 searches for the transfer function, it is reflected to the noise cancel filter NCF2, and the adjustment circuit PCC1 adjusts the analog integrator unit INTU1 based on a search result of the adaptive filter AF1". The same applies also to the adaptive filter AF2. In this example, both of the analog integrator units INTU1a and INTU2a include the circuit parameter which can be variably set. However, only one of them may include it.

Main Effect of Embodiment 7

Using the method of an embodiment 7, the same effects as those of the various effects described in the embodiment 1 can be obtained. Because the characteristic variation of the analog integrator units INTU1a and INTU2a can be kept within a predetermined range, it is possible to appropriately adjust the frequency characteristic (that is, the transfer function from the external input signal SI to the external output signal SO) of the ADC. As a result, for example, like a millimeter wave radar system of FIG. 1, in a system including a plurality of analog/digital converters ADC [1] to ADC [n], it is possible to reduce the mismatch of the frequency characteristics between the plurality of ADCs, thus enabling to improve the accuracy of the radar. Note that adjustment of the circuit parameters of the analog integrator units INTU1a and INTU2a is performed by observing the output signals of the modulators SDM1 and SDM2, instead of the external output signals SO like the case of FIG. 21, thus enabling to facilitate the adjustment or to improve the adjustment accuracy.

Embodiment 8

Scheme of Analog/Digital Converter (Embodiment 8)

Figure 16:
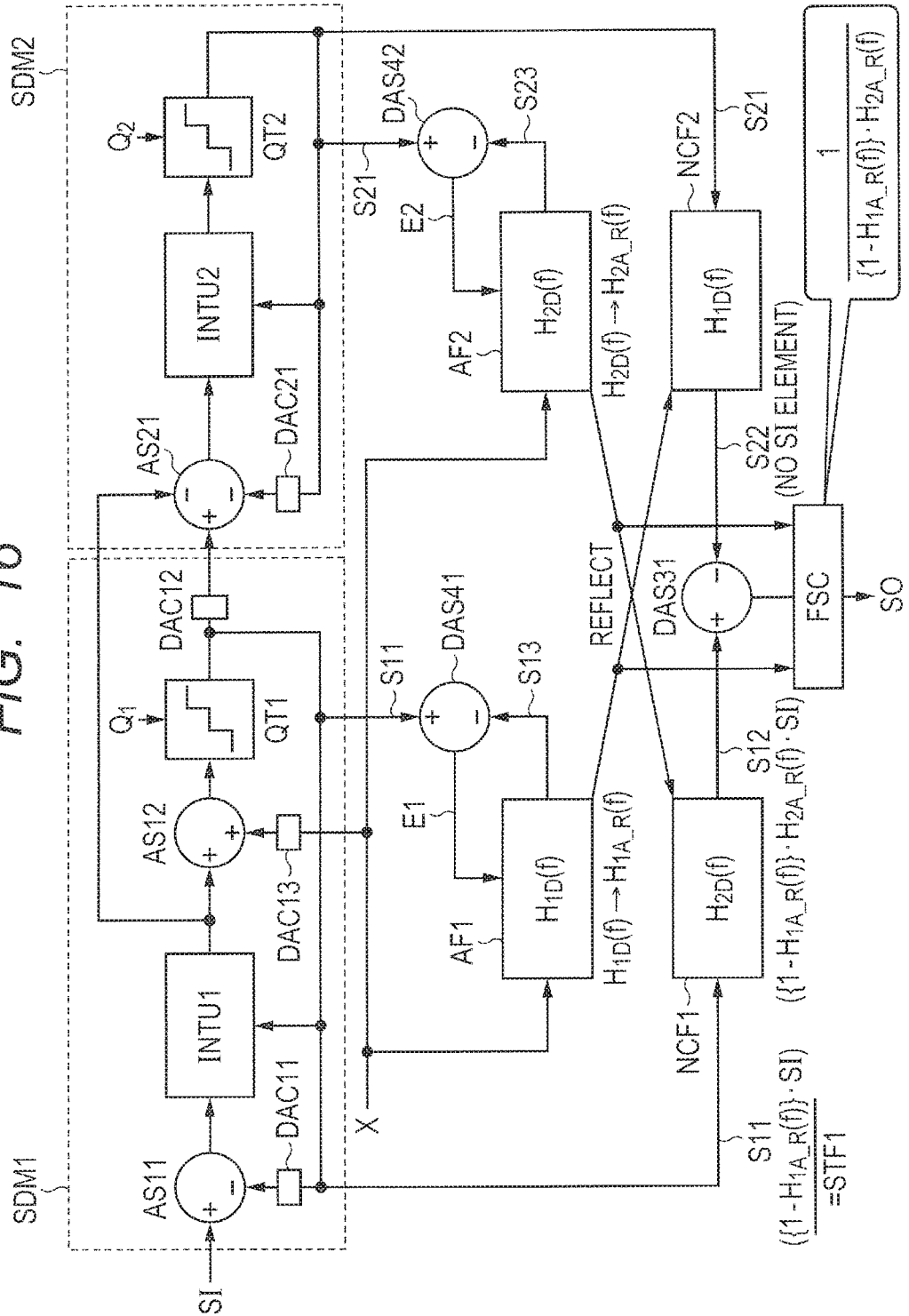
FIG. 16 is a circuit block diagram illustrating a schematic configuration example and an operation example of the main part of an analog/digital converter according to an embodiment 8 of the present invention.

FIG. 16 is a circuit block diagram illustrating a schematic configuration example and an operation example of the main part of an analog/digital converter according to an embodiment 8 of the present invention. In addition to the configuration example of FIG. 2 in the embodiment 1, the MASH type sigma-delta ADC illustrated in FIG. 16 includes a frequency characteristic correction circuit FSC. The frequency characteristic correction circuit FSC causes the search result of the adaptive filters AF1 and AF2 to be reflected to the output signal of the digital adder/subtracter DAS31. By so doing, after it adjusts the frequency characteristic of the ADC, it outputs the external output signal SO.

For example, FIG. 16 illustrates an operation example in which the frequency characteristic of the ADC is corrected to "1" (that is, a flat frequency characteristic). In FIG. 16, the output signal S11 of the modulator SDM1 (quantizer QT1) includes a component of "STF1·SI", also as described in FIG. 19. The signal transfer function (STF1) is "1−$H_{1A\_R}$ (f)". The output signal S12 of the noise cancel filter NCF1 includes a component of "$H_{1A2A\_R}$ (f)·SI" ($H_{1A2A\_R}$ (f)={1−$H_{1A\_R}$ (f)}·$H_{2A\_R}$ (f)). The output signal S22 of the noise cancel filter NCF2 does not include the component of the external input signal SI.

The frequency characteristic correction circuit FSC acquires the transfer functions $H_{1A\_R}$ (f) and $H_{2A\_R}$ (f) from the search results of the adaptive filters AF1 and AF2, and calculates an inverse function "1/$H_{1A2A\_R}$ (f)" of the transfer function $H_{1A2A\_R}$ (f) (={1−$H_{1A\_R}$ (f)}·$H_{2A\_R}$ (f)) as the signal transfer function of the entire ADC. The frequency characteristic correction circuit FSC multiplies the output signal of the digital adder/subtracter DAS31 by the inverse function "1/$H_{1A2A\_R}$ (f)", thereby flatly correcting the frequency characteristic of the ADC.

Main Effect of Embodiment 8

Using the method of an embodiment 8, the same effects as those of the various effects of the embodiment 1 can be obtained. Like the case of the embodiment 7, it is possible to reduce the mismatch of the frequency characteristics between a plurality of ADCs, and to improve the accuracy of, for example, the millimeter wave radar system. Further, in the individual ADCs, it is possible to improve the frequency characteristic (to widen the signal band).

Embodiment 9

Scheme of Analog/Digital Converter (Embodiment 9)

Figure 17:
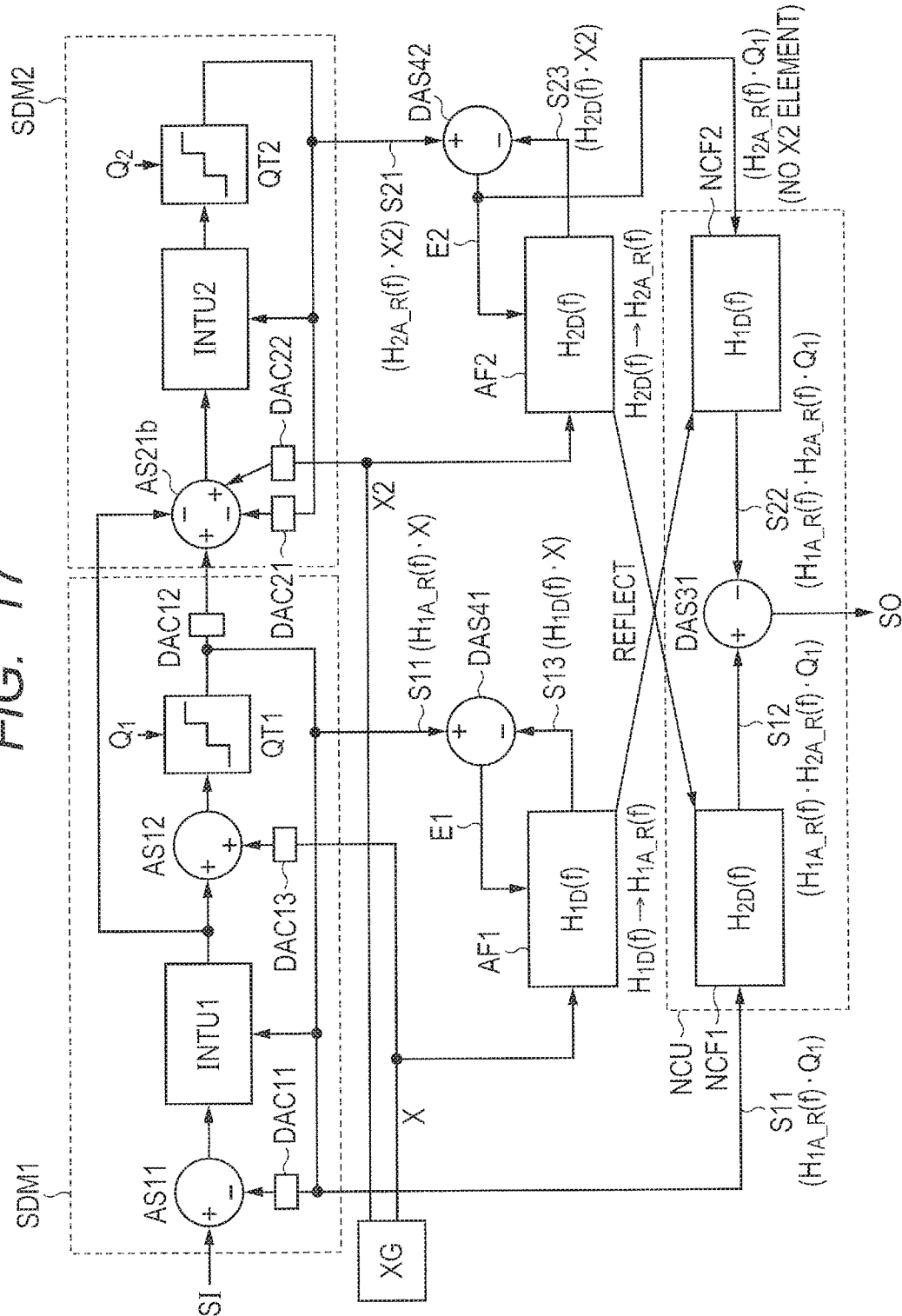
FIG. 17 is a circuit block diagram illustrating a schematic configuration example and an operation example of the main part of an analog/digital converter according to an embodiment 9 of the present invention.

FIG. 17 is a circuit block diagram illustrating a schematic configuration example and an operation example of the main part of an analog/digital converter according to an embodiment 9 of the present invention. The MASH type sigma-delta ADC illustrated in FIG. 17 has the following three different points from the configuration example of FIG. 2 in the embodiment 1. As a first point, the probe signal generation circuit XG generates a probe signal X2 in addition to the probe signal X. As a second point, the analog adder/subtracter AS21 in the modulator SDM2 is replaced by an analog adder/subtracter AS21b, and there is added a digital/analog converter circuit DAC22 which injects the probe signal X2 to the analog adder/subtracter AS21b. As a third point, an error signal E2 is input to the noise cancel filter NCF2.

Accordingly, it is possible to inject the different probe signals X and X2 respectively to the modulators SDM1 and SDM2. The probe signal X2 is, for example, a 1-bit pseudo random signal, like the probe signal X, and is generated by the M sequence different from that of the probe signal X. The signal is not correlated with the probe signal X. The adaptive filter AF2 searches for the transfer function $H_{2A\_R}$ (f) based on the error signal E2 between the output signal S21 of the modulator SDM2 (the quantizer QT2) and its own output signal S23.

At this time, unlike the case of FIG. 2, the output signal S21 includes a component of "$H_{2A\_R}$ (f)·X2" and a component of "$H_{2D}$ (f)~X2". Like the case of FIG. 2, in fact, the output signal S21 includes also a component of "$H_{2A\_R}$ (f)·X". The probe signal X and the probe signal X2 are not correlated with each other. The adaptive filter AF2 searches for the probe signal X2 as an input, instead of the probe signal X in FIG. 8. Thus, as illustrated in FIG. 8, the component of the probe signal X in the output signal S21 is ignorable, when it is assumed as an input for the adaptive filter AF2.

Using this configuration, the probe signal X2 is injected only to the modulator SDM2. Thus, unlike the probe signal X, it cannot be canceled by the noise cancel circuit NCU. To the noise cancel filter NCF2, the error signal E2 as a signal after canceling the probe signal X2 is input. Though not illustrated, the error signal E2 includes the component of the quantization error $Q_2$ and the component of the probe signal X, in addition to the component of the quantization error $Q_1$. The component of the quantization error $Q_1$ and the component of the probe signal X are cancelled by the noise cancel circuit NCU.

Main Effect of Embodiment 9

Using the method of the embodiment 9, the same effects as those of the various effects described in the embodiment 1 can be obtained. From a viewpoint of the searching accuracy of the adaptive filter AF2, the method of the embodiment 1 may be more preferred. That is, the adaptive filter AF2 needs to search for the transfer function $H_{2A\_R}$ (f) (that is, a transfer function from the application point of the quantization error $Q_1$ up to the output signal S21 of the modulator SDM2). However, in this case, it searches for a signal transfer function (STF2) of the modulator SDM2. The transfer function $H_{2A\_R}$ (f) and the signal transfer function (STF2) do not necessarily coincide with each other. For example, as described in the embodiment 3, when the analog integrator described in FIG. 4A and FIG. 4B is used for the analog integrator unit INTU1, or when the configuration of FIG. 17 is modified in a form of FIG. 11, a difference is generated between the transfer function $H_{2A\_R}$ (f) and the signal transfer function (STF2).

Embodiment 10

Scheme of Analog/Digital Converter (Embodiment 10)

Figure 18:
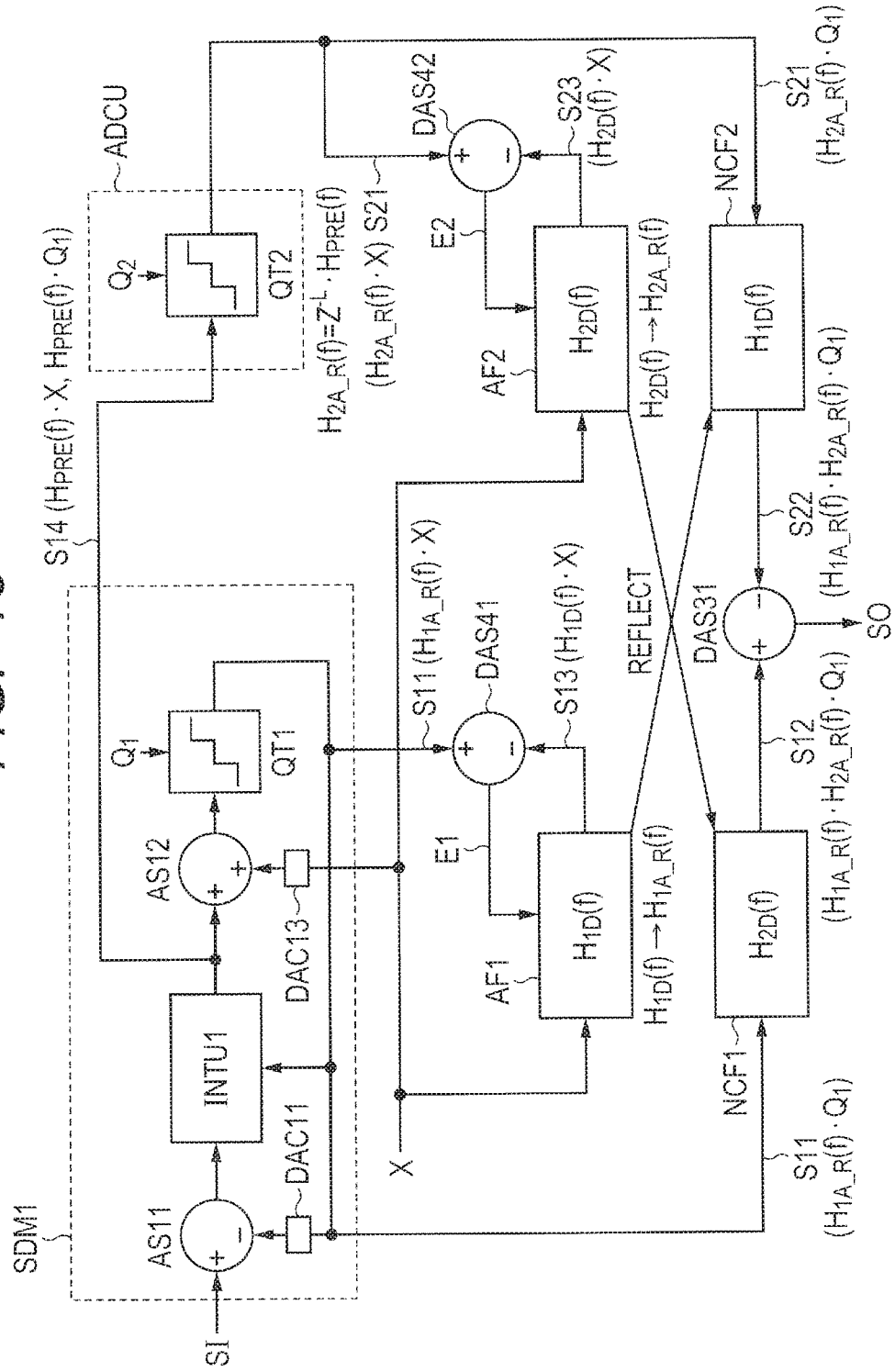
FIG. 18 is a circuit block diagram illustrating a schematic configuration example and an operation example of the main part of an analog/digital converter according to an embodiment 10 of the present invention.

FIG. 18 is a circuit block diagram illustrating a schematic configuration example and an operation example of the main part of an analog/digital converter according to an embodiment 10 of the present invention. As compared with the configuration example of FIG. 11 in the embodiment 3, in the MASH type sigma-delta ADC illustrated in FIG. 18, the modulator SDM2 as the sigma-delta type modulator is replaced by a Nyquist-type analog/digital converter unit ADCU. The analog/digital converter unit ADCU includes only the quantizer QT2, for example, a pipe-line type ADC, a successive comparison type ADC, a cyclic type ADC, a flash type ADC, or a mixed type thereof. This configuration can also be a MASH type sigma-delta ADC, when the integration degree of the modulator in the second stage in FIG. 11 is 0-degree.

Like the case of FIG. 11, the output signal from the modulator SDM1 includes the component of "$H_{PRE}$ (f)·$Q_1$" and the component of "$H_{PRE}$ (f)·X". The transfer function of the Nyquist-type analog/digital converter unit ADCU is "$z^{-L}$" (L is a clock function necessary for A/D conversion). The adaptive filter AF2 searches for "$z^{-L} \cdot H_{PRE}$ (f)" as a transfer function $H_{2A\_R}$ (f).

Main Effect of Embodiment 10

Using the method of an embodiment 10, the same effects as the various effects described in the embodiment 3 can be obtained. The number of bits of the Nyquist-type analog/digital converter unit ADCU can be greater than the number of bits of the quantizer in the sigma-delta type modulator, thereby reducing the quantization error $Q_2$. That is, as compared with the configuration example of FIG. 11, instead of lowering the integration degree for the quantization error $Q_2$ (resulting in weakening the noise shaping effect), it is possible to reduce the quantization error $Q_2$ itself. As a result, it is possible to attain a high resolution of the MASH type sigma-delta ADC.

The inventions by the present inventors have specifically been described based on the preferred embodiments. The present invention is not limited to the preferred embodiments, and various changes may be made without departing from the scope thereof. For example, above-described embodiments have specifically been described for easy description of the present invention, and are not to limit to any of those including the entire above-described configuration. A part of the configuration of one embodiment may possibly be replaced by the configuration of another embodiment, and the configuration of one embodiment may be added to the configuration of another embodiment. A part of the configuration of each embodiment may be added to, deleted from, or replaced by the configuration of another embodiment.

For example, the MASH type sigma-delta ADC having the configuration with two stages has been described by way of example. However, it may be extended to three or more stages.

Additional Note (1) A correction method for a MASH (Multi stAge Noise SHaping) type and sigma-delta type analog/digital converter having a first modulator which includes a first analog integrator including an analog circuit and a first quantizer quantizing an output signal of the first analog integrator, and to which an external input signal as an analog signal is input, a second modulator which is coupled to a latter stage of the first modulator and includes a second quantizer, a noise cancel circuit which cancels an quantization error generated by the first quantizer using a first noise cancel filter to which an output signal of the first quantizer is input and a second noise cancel filter to which an output signal of the second quantizer is input, the correction method comprising:
 a first step of injecting a probe signal to the first modulator;
 a second step of searching for a transfer function of the first modulator by observing the output signal of the first quantizer in accordance with the probe signal;
 a third step of searching for a transfer function of the second modulator by observing the output signal of the second quantizer in accordance with the probe signal;
 a fourth step of causing a search result of the second step to be reflected to a tap coefficient of the second noise cancel filter; and
 a fifth step of causing a search result of the third step to be reflected to a tap coefficient of the first noise cancel filter.
 (2) A MASH (Multi stAge Noise SHaping) type and sigma-delta type analog/digital converter comprising:
 a first modulator which includes a first analog integrator including an analog circuit and a first quantizer quantizing an output signal of the first analog integrator, and to which an external input signal as an analog signal is input;
 a Nyquist type analog/digital converter unit which is coupled to a latter stage of the first modulator and includes a second quantizer;
 a probe signal generation circuit which injects a probe signal to the first modulator;
 a first adaptive filter which searches for a transfer function of the first modulator by observing the output signal of the first quantizer in accordance with the probe signal;
 a second adaptive filter which searches for a transfer function of the Nyquist type analog/digital converter unit by observing the output signal of the second quantizer in accordance with the probe signal; and
 a noise cancel circuit which cancels an quantization error generated by the first quantizer using a search result of the first adaptive filter and a search result of the second adaptive filter.

What is claimed is:
1. A MASH (Multi stAge Noise SHaping) type and sigma-delta type analog/digital converter comprising:
 a first modulator which includes a first analog integrator including an analog circuit and a first quantizer quantizing an output signal of the first analog integrator, and to which an external input signal as an analog signal is input;
 a second modulator which is coupled to a latter stage of the first modulator and includes a second quantizer;
 a probe signal generation circuit which injects a probe signal to the first modulator;
 a first adaptive filter which searches for a transfer function of the first modulator by observing an output signal of the first quantizer in accordance with the probe signal;
 a second adaptive filter which searches for a transfer function of the second modulator by observing an output signal of the second quantizer in accordance with the probe signal; and
 a noise cancel circuit which cancels an quantization error generated by the first quantizer using a search result of the first adaptive filter and a search result of the second adaptive filter.

2. The analog/digital converter according to claim 1, wherein the probe signal is a pseudo random signal.
3. The analog/digital converter according to claim 2, wherein the probe signal is a 1-bit pseudo random signal.
4. The analog/digital converter according to claim 1, wherein the probe signal is an analog signal, and injected to an input signal of the first quantizer through a third analog adder/subtracter.
5. The analog/digital converter according to claim 1, wherein the probe signal is a digital signal, and injected to an output signal of the first quantizer through a third digital adder/subtracter.
6. The analog/digital converter according to claim 1, wherein the noise cancel circuit includes:
 a first noise cancel filter which is a digital filter to which the output signal of the first quantizer is input, and includes a tap coefficient based on the search result of the second adaptive filter,
 a second noise cancel filter which is a digital filter to which the output signal of the second quantizer is input, and includes a tap coefficient based on the search result of the first adaptive filter, and
 a first digital adder/subtracter which calculates a difference between an output signal of the first noise cancel filter and an output signal of the second noise cancel filter.
7. The analog/digital converter according to claim 1, wherein the first adaptive filter searches for its own tap coefficient using an LMS (Least Mean Square) algorithm, based on a first error signal as an error between the output signal of the first quantizer in accordance with the probe signal and an output signal of the first adaptive filter, and
 wherein the second adaptive filter searches for its own tap coefficient using the LMS algorithm, based on a second error signal as an error between the output signal of the second quantizer in accordance with the probe signal and an output signal of the second adaptive filter.
8. The analog/digital converter according to claim 7, wherein each of the first adaptive filter and the second adaptive filter includes a plurality of tap circuits and a digital adder which adds an output signal of each of the tap circuits,
 wherein each of the tap circuits includes
 a first digital multiplier which multiplies a corresponding error signal of the first error signal and the second error signal by a delay probe signal,
 a digital integrator which integrates a value obtained by multiplying a multiplication result of the first digital multiplier by a predetermined step coefficient, and
 a second digital multiplier which multiplies the delay probe signal by an integration result of the digital integrator, and outputs this multiplication result to the digital adder, and
 wherein the delay probe signal differs between the tap circuits, and is obtained by delaying the probe signal by degrees different between the tap circuits.
9. The analog/digital converter according to claim 1, wherein the first analog integrator includes a circuit parameter which can be variably set, and wherein the analog/digital converter further includes an adjustment circuit which adjusts the circuit parameter of the first analog integrator based on the search result of the first adaptive filter.

10. The analog digital converter according to claim 6, further comprising
a frequency characteristic correction circuit which corrects a frequency characteristic of the analog/digital converter, by causing the search result of the first adaptive filter and the search result of the second adaptive filter to be reflected to an output signal of the first digital adder/subtracter.

11. A MASH (Multi stAge Noise SHaping) type and sigma-delta type analog/digital converter comprising:
a first modulator to which an external input signal as an analog signal is input, and which includes a first quantizer;
a second modulator which is coupled to a latter stage of the first modulator and includes a second quantizer;
a probe signal generation circuit which generates a first probe signal and injects the first probe signal to the first modulator;
a first adaptive filter which searches for a transfer function of the first modulator by observing an output signal of the first quantizer in accordance with the first probe signal;
a second adaptive filter which searches for a transfer function of the second modulator by observing an output signal of the second quantizer; and p1 a noise cancel circuit which cancels an quantization error generated by the first quantizer using a search result of the first adaptive filter and a search result of the second adaptive filter,
wherein the first modulator includes
a first analog integrator which includes an analog circuit,
the first quantizer which quantizes an output signal of the first analog integrator,
a first digital/analog converter circuit which converts an output signal of the first quantizer into an analog signal, and
a first analog adder/subtracter which outputs a differential signal between the external input signal and an output signal of the first digital/analog converter circuit.

12. The analog/digital converter according to claim 11, wherein the first probe signal is injected to an input signal or output signal of the first quantizer.

13. The analog/digital converter according to claim 11, wherein the first probe signal is injected to the first analog adder/subtracter.

14. The analog/digital converter according to claim 11, wherein the second modulator includes
a second analog integrator which includes an analog circuit,
the second quantizer which quantizes an output signal of the second analog integrator,
a second digital/analog converter circuit which converts an output signal of the second quantizer into an analog signal, and
a second analog adder/subtracter which outputs a differential signal between a first signal including a component of the quantization error as a signal from the first modulator and an output signal of the second digital/analog converter circuit, to the second analog integrator.

15. The analog/digital converter according to claim 14, wherein the first probe signal is injected to the first analog adder/subtracter and the second analog adder/subtracter.

16. The analog/digital converter according to claim 14, wherein the probe signal generation circuit further generates a second probe signal, and injects the second probe signal to the second analog adder/subtracter, and
wherein the second adaptive filter searches for a transfer function of the second modulator by observing an output signal of the second quantizer in accordance with the second probe signal.

17. The analog/digital converter according to claim 14, wherein the second integrator includes a circuit parameter which can be variably set, and
wherein the analog/digital converter further has an adjustment circuit which adjusts the circuit parameter of the second analog integrator based on a search result of the second adaptive filter.

18. A millimeter wave radar system comprising:
a high frequency unit which transmits a transmission wave to an object, and generates a plurality of beat signals by down-converting a reflected wave from the object which is received by a plurality of antennas, using the transmission wave;
a low-pass filter to which the beat signals are input; and
a baseband unit which processes the beat signals from the low-pass filter,
wherein the baseband unit includes a plurality of MASH (Multi stAge Noise SHaping) type and sigma-delta type analog/digital converters each of which converts each of the beat signals from the low-pass filter into a digital signal,
wherein each of the analog/digital converters includes
a first modulator which includes a first analog integrator including an analog circuit and a first quantizer quantizing an output signal of the first analog integrator, and to which a corresponding beat signal of the beat signals is input,
a second modulator which is coupled to a latter stage of the first modulator, and includes a second analog integrator including an analog circuit and a second quantizer quantizing an output signal of the second analog integrator,
a probe signal generation circuit which injects a probe signal to the first modulator,
a first adaptive filter which searches for a transfer function of the first modulator by observing an output signal of the first quantizer in accordance with the probe signal,
a second adaptive filter which searches for a transfer function of the second modulator by observing an output signal of the second quantizer in accordance with the probe signal, and
a noise cancel circuit which cancels a quantization error generated by the first quantizer using a search result of the first adaptive filter and a search result of the second adaptive filter.

19. The millimeter wave radar system according to claim 18,
wherein the first analog integrator or the second analog integrator includes a circuit parameter which can be variably set, and
wherein each of the analog/digital converters has an adjustment circuit controlling the circuit parameter of the first analog integrator based on a search result of the first adaptive filter or adjusting the circuit parameter of the second analog integrator based on a search result of the second adaptive filter.

20. The millimeter wave radar system according to claim 18,
wherein the noise cancel circuit includes
a first noise cancel filter which is a digital filter to which an output signal of the first quantizer is input and includes a tap coefficient based on a search result of the second adaptive filter,
a second noise cancel filter which is a digital filter to which an output signal of the second quantizer is input and includes a tap coefficient based on a search result of the first adaptive filter, and
a first digital adder/subtracter which calculates a difference between an output signal of the first noise cancel filter and an output signal of the second noise cancel filter, and
wherein each of the analog/digital converters further has a frequency characteristic correction circuit which corrects its own frequency characteristic by causing a search result of the first adaptive filter and a search result of the second adaptive filter to be reflected to an output signal of the first digital adder/subtracter.

* * * * *